United States Patent
Kim et al.

(10) Patent No.: US 10,996,777 B2
(45) Date of Patent: May 4, 2021

(54) INPUT SENSING UNIT AND ELECTRONIC DEVICE INCLUDING THE SAME

(71) Applicant: Samsung Display Co., Ltd., Yongin-si (KR)

(72) Inventors: Jong-hwa Kim, Seoul (KR); Il-joo Kim, Hwaseong-si (KR); Duckjoong Kim, Busan (KR); Kyungsu Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 8 days.

(21) Appl. No.: 16/387,466

(22) Filed: Apr. 17, 2019

(65) Prior Publication Data

US 2019/0346943 A1    Nov. 14, 2019

(30) Foreign Application Priority Data

May 8, 2018 (KR) .................. 10-2018-0052495

(51) Int. Cl.
*G06F 3/041* (2006.01)
*G06F 3/044* (2006.01)
*H01L 27/32* (2006.01)

(52) U.S. Cl.
CPC ............ *G06F 3/041* (2013.01); *G06F 3/0443* (2019.05); *G06F 3/0446* (2019.05); *G06F 3/0448* (2019.05); *G06F 3/04164* (2019.05); *G06F 2203/04111* (2013.01); *H01L 27/323* (2013.01)

(58) Field of Classification Search
CPC .. G06F 3/04164; G06F 3/0412; G06F 3/0416; G06F 3/044; G06F 3/041; G06F 2203/04111; G06F 2203/04107; G06F 3/0446; G06F 3/0443; G06F 3/0448
See application file for complete search history.

(56) References Cited

U.S. PATENT DOCUMENTS

| | | | | |
|---|---|---|---|---|
| 8,493,349 | B2 * | 7/2013 | Hwang | G06F 3/0446 345/173 |
| 8,816,967 | B2 * | 8/2014 | Lyon | G06F 3/044 178/18.06 |
| 9,746,947 | B2 * | 8/2017 | Chae | G06F 3/041 |
| 9,933,886 | B2 * | 4/2018 | Kim | G09G 3/3208 |
| 9,952,733 | B2 | 4/2018 | Han et al. | |
| 10,042,492 | B2 * | 8/2018 | Lesonen | G06F 3/04164 |
| 10,120,516 | B2 * | 11/2018 | Wang | G06F 3/044 |
| 10,146,377 | B2 * | 12/2018 | Park | G06F 3/0443 |
| 10,159,146 | B2 * | 12/2018 | Tsurusaki | G06F 1/1643 |

(Continued)

FOREIGN PATENT DOCUMENTS

| KR | 10-1385438 | 4/2014 |
|---|---|---|
| KR | 10-2016-0057573 | 5/2016 |

(Continued)

*Primary Examiner* — Michael J Jansen, II
(74) *Attorney, Agent, or Firm* — H.C. Park & Associates, PLC

(57) ABSTRACT

An electronic device including an input sensing unit configured to sense an external input. The input sensing unit includes first electrodes including first patterns including normal patterns and notch patterns and first connection patterns connecting the first patterns, a second electrode, a first trace line connected to one of the normal patterns, and a connection trace line connected to at least two of the notch patterns.

13 Claims, 16 Drawing Sheets

(56) References Cited

U.S. PATENT DOCUMENTS

| | | | |
|---|---|---|---|
| 10,180,744 B2* | 1/2019 | Su | H01L 21/77 |
| 10,360,862 B2* | 7/2019 | Yeh | G09G 3/3666 |
| 10,475,862 B2* | 11/2019 | Jeong | H01L 27/3262 |
| 10,488,966 B2* | 11/2019 | Rhe | G06F 3/047 |
| 10,564,784 B2* | 2/2020 | Koike | G01B 7/22 |
| 10,585,305 B2* | 3/2020 | Zhou | G02F 1/136286 |
| 10,592,016 B2* | 3/2020 | Jeon | G06F 3/041 |
| 10,705,662 B2* | 7/2020 | Zhang | G06F 3/0412 |
| 10,754,463 B2* | 8/2020 | Kim | G09G 3/3208 |
| 10,795,475 B2* | 10/2020 | Han | H01L 27/3223 |
| 10,824,257 B2* | 11/2020 | Kim | G06F 3/0412 |
| 10,838,532 B2* | 11/2020 | Abe | G06F 3/0416 |
| 10,860,156 B2* | 12/2020 | Moon | G06F 3/04164 |
| 2010/0073319 A1* | 3/2010 | Lyon | H03K 17/9622 |
| | | | 345/174 |
| 2011/0141037 A1* | 6/2011 | Hwang | G06F 3/044 |
| | | | 345/173 |
| 2011/0304578 A1* | 12/2011 | Kim | G06F 3/044 |
| | | | 345/174 |
| 2012/0182233 A1* | 7/2012 | Kim | G06F 3/044 |
| | | | 345/173 |
| 2015/0002761 A1* | 1/2015 | Tsurusaki | G06F 1/1643 |
| | | | 349/12 |
| 2015/0185892 A1* | 7/2015 | Chae | G06F 3/0443 |
| | | | 345/173 |
| 2016/0139728 A1 | 5/2016 | Jeon et al. | |
| 2016/0170523 A1* | 6/2016 | Park | G06F 3/044 |
| | | | 345/174 |
| 2016/0202831 A1* | 7/2016 | Kim | G06F 3/0443 |
| | | | 345/173 |
| 2016/0239131 A1 | 8/2016 | Kang | |
| 2017/0017342 A1* | 1/2017 | Wu | G06F 3/0416 |
| 2017/0075463 A1* | 3/2017 | Wang | G06F 3/0443 |
| 2017/0185224 A1* | 6/2017 | Nagata | G06F 3/044 |
| 2018/0011373 A1* | 1/2018 | Zhou | G02F 1/1339 |
| 2018/0074609 A1* | 3/2018 | Jeon | G06F 3/041 |
| 2018/0120988 A1* | 5/2018 | Kim | G06F 3/0412 |
| 2018/0224975 A1* | 8/2018 | Koike | G01B 7/22 |
| 2018/0348926 A1* | 12/2018 | Su | H01L 27/3276 |
| 2018/0348929 A1* | 12/2018 | Rhe | G06F 3/0412 |
| 2019/0051708 A1* | 2/2019 | Jeong | H01L 27/3223 |
| 2019/0056819 A1 | 2/2019 | Moon et al. | |
| 2019/0064954 A1* | 2/2019 | Ho | G06F 3/04164 |
| 2019/0073976 A1* | 3/2019 | Yeh | G02F 1/136286 |
| 2019/0204952 A1* | 7/2019 | Han | H01L 27/3246 |
| 2019/0206894 A1* | 7/2019 | Lee | H01L 27/124 |
| 2019/0227646 A1* | 7/2019 | Ye | G06F 3/0446 |
| 2019/0243486 A1* | 8/2019 | Zhang | G06F 3/0446 |
| 2019/0250746 A1* | 8/2019 | Han | H01L 27/323 |
| 2019/0265824 A1* | 8/2019 | Abe | G06F 3/0416 |
| 2019/0294281 A1* | 9/2019 | Kim | G06F 3/0412 |
| 2019/0302942 A1* | 10/2019 | Kim | G06F 3/047 |
| 2019/0346943 A1* | 11/2019 | Kim | G06F 3/0446 |
| 2020/0004362 A1* | 1/2020 | Yang | G06F 3/04886 |
| 2020/0012387 A1* | 1/2020 | Kim | H01L 27/3276 |
| 2020/0013360 A1* | 1/2020 | Yeh | G09G 3/002 |
| 2020/0042120 A1* | 2/2020 | Gogte | G06F 3/0443 |
| 2020/0050311 A1* | 2/2020 | Rhe | G06F 3/0416 |
| 2020/0052044 A1* | 2/2020 | Jeong | H01L 51/5281 |
| 2020/0057530 A1* | 2/2020 | Moon | G06F 3/0412 |
| 2020/0064968 A1* | 2/2020 | Kim | G06F 1/1686 |
| 2020/0081571 A1* | 3/2020 | Kim | G06F 3/0448 |
| 2020/0089350 A1* | 3/2020 | Han | G06F 3/04164 |
| 2020/0089352 A1* | 3/2020 | Kwon | G06F 3/0416 |
| 2020/0089355 A1* | 3/2020 | Moon | G06F 3/044 |
| 2020/0098793 A1* | 3/2020 | Kim | G06F 3/044 |

FOREIGN PATENT DOCUMENTS

| | | |
|---|---|---|
| KR | 10-2016-0072909 | 6/2016 |
| KR | 10-2016-0101295 | 8/2016 |
| KR | 10-2019-0020213 | 2/2019 |
| KR | 10-2019-0098295 | 8/2019 |

\* cited by examiner

INPUT SENSING UNIT AND ELECTRONIC DEVICE INCLUDING THE SAME

CROSS-REFERENCE TO RELATED APPLICATION

This application claims priority from and the benefit of Korean Patent Application No. 10-2018-0052495, filed on May 8, 2018, which is hereby incorporated by reference for all purposes as if fully set forth herein.

BACKGROUND

Field

Exemplary embodiments of the present invention relate generally to an input sensing unit and an electronic device including the same, and, more specifically, to an input sensing unit having improved touch sensitivity, and an electronic device including the same.

Discussion of the Background

An electronic device may include an active area which is activated by an electrical signal. The electronic device may sense a touch applied from the outside through the active area and may display various images to provide information to a user.

A shape of the active area of the electronic device may be changed in various ways depending on the purpose of use. Recently, active areas having various shapes have been developed with the development of electronic devices having various shapes.

The above information disclosed in this Background section is only for understanding of the background of the inventive concepts, and, therefore, it may contain information that does not constitute prior art.

SUMMARY

Exemplary embodiments of the present invention provide an input sensing unit having improved touch sensitivity, and an electronic device including the same.

Additional features of the inventive concepts will be set forth in the description which follows, and in part will be apparent from the description, or may be learned by practice of the inventive concepts.

An exemplary embodiment of the present invention provides an electronic device including: a base member including a sensing area and a non-sensing area adjacent to the sensing area, the sensing area including a first area, a second area protruding from the first area in one direction, and a third area spaced apart from the second area and protruding from the first area in the one direction, when viewed in a plan view; and an input sensing unit disposed on the base member and configured to sense an external input. The input sensing unit includes: first electrodes including first patterns including normal patterns disposed in the sensing area and notch patterns disposed in the second and third areas, and first connection patterns connecting the first patterns; a second electrode including sensor patterns spaced apart from the first patterns in a plan view and second connection patterns connecting the sensor patterns; a first trace line disposed in the non-sensing area and connected to one of the normal patterns; a second trace line disposed in the non-sensing area and connected to one of the sensor patterns; and a connection trace line connected to at least two of the notch patterns.

The input sensing unit may further include a connection portion that protrudes toward the non-sensing area to overlap with the non-sensing area in a plan view and is connected to the notch pattern. The connection trace line may overlap with the connection portion when viewed in a plan view.

The input sensing unit may further include an insulating layer disposed between the connection trace line and the connection portion. The insulating layer may include an opening exposing a portion of the connection trace line, and the connection trace line may be connected to the connection portion through the opening.

The connection trace line may be disposed on a layer different from a layer on which the notch patterns are disposed.

The first patterns and the sensor patterns may be disposed on the same layer, and the first connection patterns may be disposed on a layer different from the layer on which the first patterns are disposed.

The connection trace line may connect the notch patterns which are connected to each other by the first connection pattern.

Each of the second connection patterns may include an opening. Each of the first connection patterns may include an island pattern disposed between two patterns of the first patterns and disposed in the opening, a first branch pattern connecting one of the two patterns to the island pattern, and a second branch pattern connecting the other of the two patterns to the island pattern.

The input sensing unit may further include a dummy pattern disposed between the sensor patterns, and the dummy pattern may include the same material as the sensor patterns.

The input sensing unit may further include an auxiliary line disposed in the non-sensing area and connecting the sensor pattern disposed in the second area to the sensor pattern disposed in the third area. The connection trace line may be electrically insulated from the auxiliary line.

The auxiliary line and the connection trace line may be disposed on the same layer.

The connection trace line may include an additional pattern protruding in a direction toward the notch patterns. The additional pattern may be connected to the notch patterns and may be disposed on a layer different from a layer on which the auxiliary line is disposed.

The notch patterns may be arranged along sides of the second and third areas which face each other, and areas of the notch patterns may be less than areas of the normal patterns.

Another exemplary embodiment of the present invention provides an electronic device including: first electrodes including a notch connection pattern having a single branch portion, notch patterns arranged in a first direction and connected to each other by the notch connection pattern, a normal connection pattern including a plurality of branch portions and spaced apart from the notch connection pattern in a second direction intersecting the first direction, and normal patterns arranged in the first direction and connected to each other by the normal connection pattern; a second electrode including sensor patterns arranged in the second direction and a connection pattern connecting the sensor patterns; a first trace line connected to the normal patterns of the first electrodes; a connection trace line connected to the notch patterns of the first electrodes; and a second trace line connected to the second electrode. The connection trace line connects the notch patterns.

Each of the notch patterns may have a shape in which a portion of a normal pattern, having a maximum area, of the normal patterns is removed.

The connection trace line may be spaced apart from the notch connection pattern in the second direction.

Another exemplary embodiment of the present invention provides an input sensing unit including: a first node including a first connection pattern, a first pattern connected to one side of the first connection pattern, and a second pattern connected to another side of the first connection pattern; a second node including a second connection pattern overlapping with the first connection pattern in a plan view, and a third pattern connected to one side of the second connection pattern and spaced apart from the first pattern and the second pattern; and a connection trace line which connects the first pattern and the second pattern and is spaced apart from the first connection pattern in a direction intersecting an extending direction of the first connection pattern. Areas of the first and second patterns are less than an area of the third pattern.

The first connection pattern may extend in the same direction as the connection trace line.

Each of the first and second patterns may further include a connection portion protruding in a direction toward the connection trace line and overlapping with the connection trace line in a plan view.

The connection trace line may further include an additional pattern protruding from the connection trace line in a direction toward the first node. The additional pattern may be connected to the first pattern and the second pattern.

The connection trace line may overlap with the first pattern and the second pattern when viewed in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the present invention, and together with the description serve to explain the inventive concepts.

DETAILED DESCRIPTION

Figure 1:
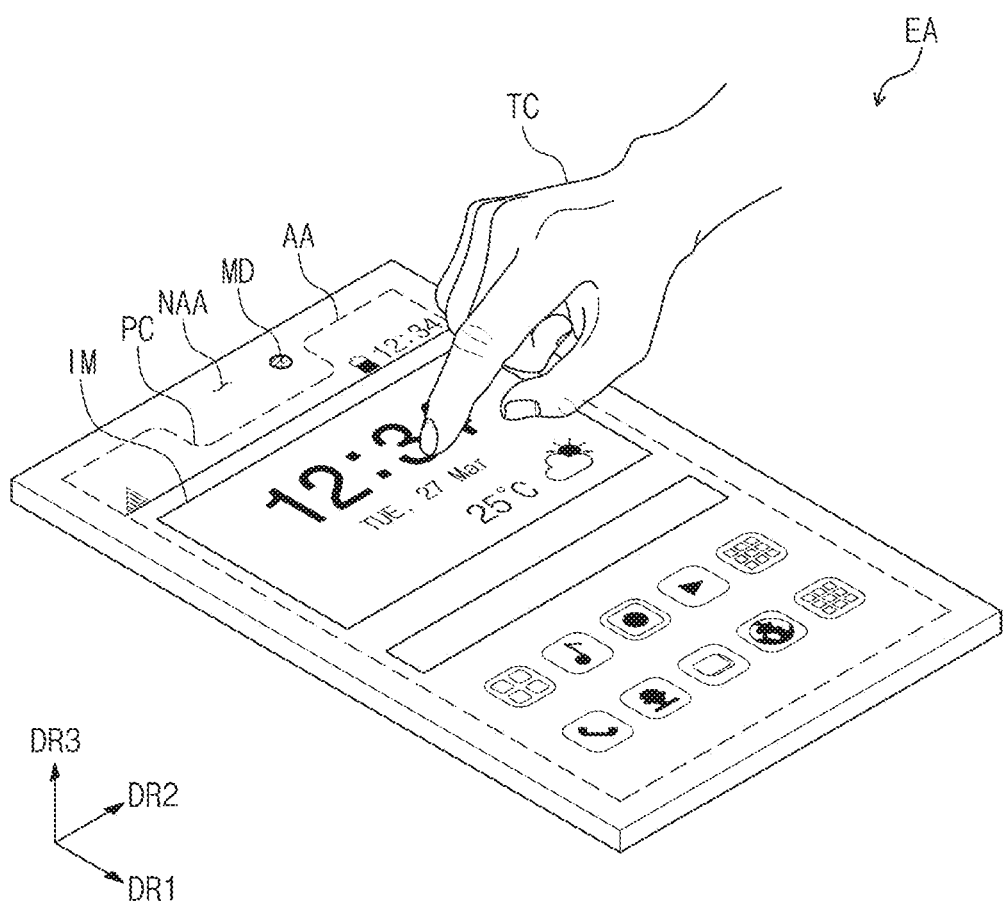
FIG. 1 is a perspective view illustrating an electronic device according to an exemplary embodiment of the present invention.

In the following description, for the purposes of explanation, numerous specific details are set forth in order to provide a thorough understanding of various exemplary embodiments of the invention. As used herein "embodiments" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
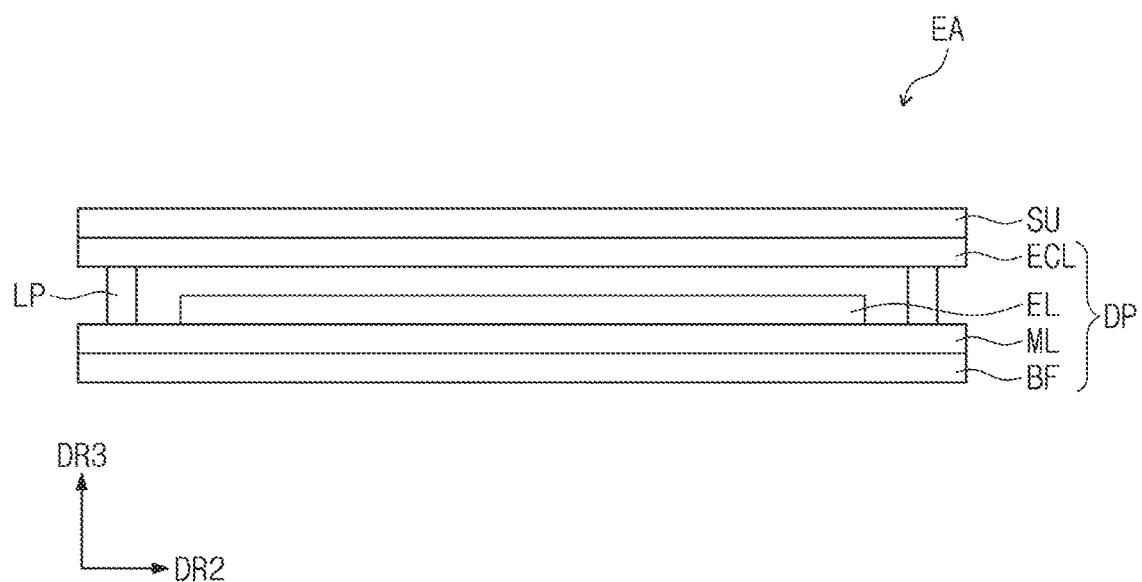
FIG. 2A and FIG. 2B are cross-sectional views illustrating electronic devices according to exemplary embodiments of the present invention.
Figure 2B:
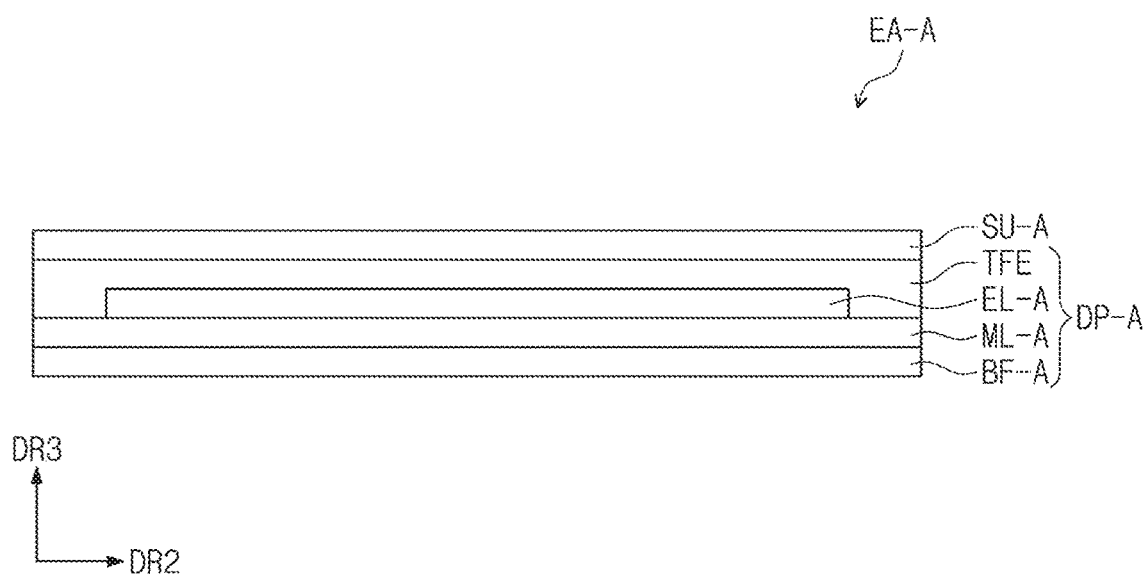
Figure 3:
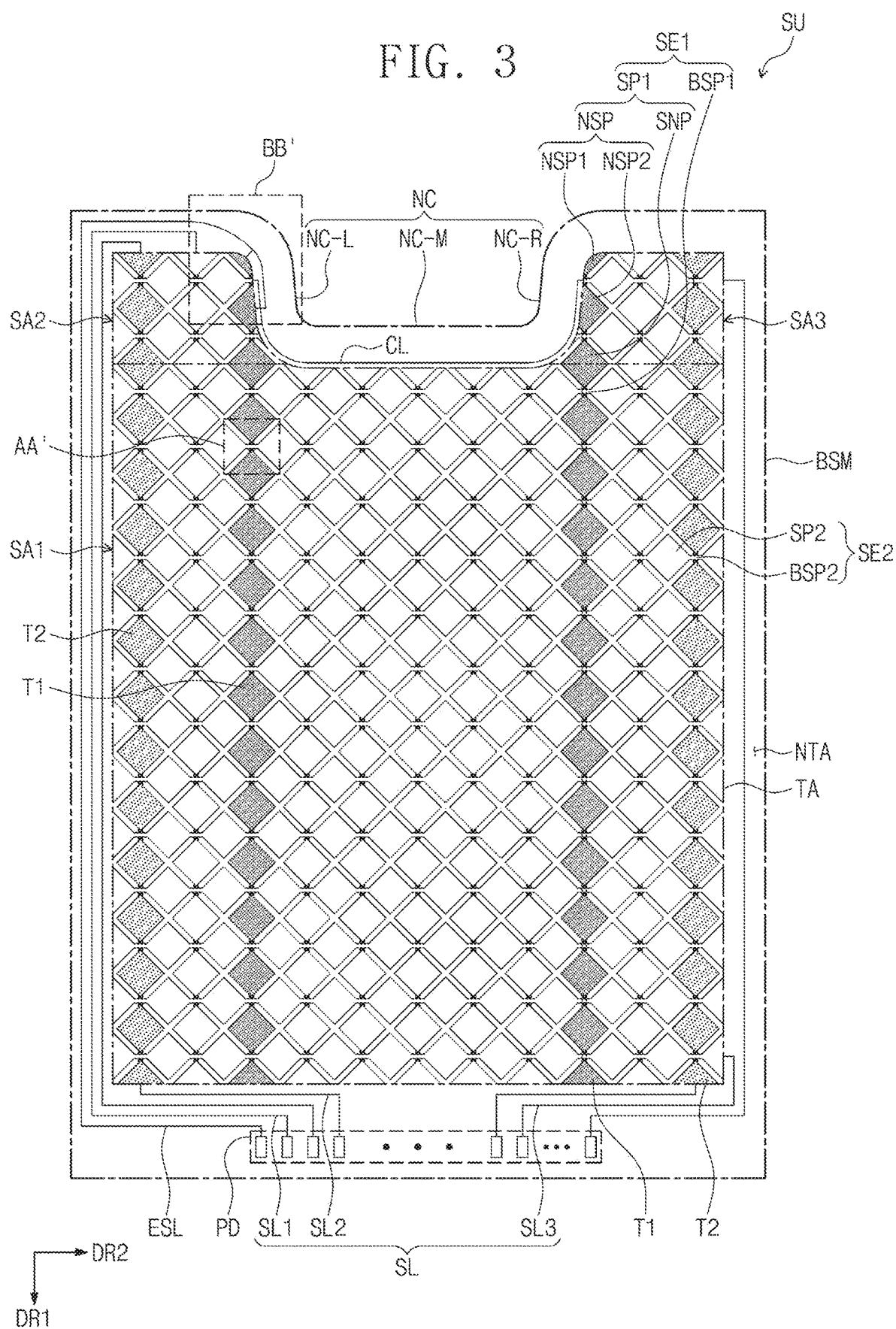
FIG. 3 is a plan view illustrating an input sensing unit according to an exemplary embodiment of the present invention.

FIG. 1 is a perspective view illustrating an electronic device according to an exemplary embodiment of the present invention. FIGS. 2A and 2B are cross-sectional views illustrating electronic devices according to some embodiments of the present invention. FIG. 3 is a plan view illustrating an input sensing unit according to an exemplary embodiment of the present invention. Hereinafter, an electronic device EA according to an exemplary embodiment of the present invention will be described with reference to FIGS. 1 to 3.

An electronic device EA may be activated by an electrical signal applied thereto. The electronic device EA may include an active area AA and a peripheral area NAA when viewed in a plan view defined by a first direction DR1 and a second direction DR2.

For example, the active area AA may be a sensing area that senses an input provided from the outside. As illustrated in FIG. 1, the electronic device EA may sense an external input TC applied to the active area AA. In this point, the electronic device EA may function as an input device.

A finger of a user is illustrated as an example of the external input TC in FIG. 1. However, the inventive concepts are not limited thereto. In another exemplary embodiment, the external input TC may be provided in various forms. For example, the external input TC may include an input (e.g., a hovering input) proximate to the electronic device EA at a predetermined interval as well as a touch of a part (e.g., a finger) of the body of a user. In addition, the external input TC may be provided in other various forms such as force, pressure, and/or light.

In addition, the active area AA may be, for example, a display area that displays predetermined information. The electronic device EA may display an image in the active area AA, and a user may obtain information through the image. Regarding this point, the electronic device EA may function as an output device.

A frame image showing a time and a date is illustrated as an example of an image IM displayed in the active area AA in FIG. 1.

In an exemplary embodiment of the present invention, the active area AA may include a recess PC. In an exemplary embodiment, the recess PC may have a shape which is recessed from one side of the active area AA in the first direction DR1. Here, the one side of the active area AA may extend in the second direction DR2. However, the inventive concepts are not limited thereto. In other exemplary embodiments, the active area AA may have a polygonal shape and/or a curved shape.

In an exemplary embodiment, the recess PC may be an area in which an electronic module MD is disposed. The electronic module MD may include at least one of various functional modules for operating the electronic device EA. For example, the electronic module MD may include at least one of a control module electrically connected to a display panel DP, a wireless communication module, an image input module, a sound input module, a memory, or an external interface. In addition, the electronic module MD may include at least one of a sound output module, a light emitting module, a light receiving module, or a camera.

In an exemplary embodiment, the peripheral area NAA may be adjacent to the active area AA. Even though an electrical signal is applied to the peripheral area NAA, the peripheral area NAA may not display an image and/or may not sense an external input.

Signal lines and/or driving elements may be disposed in the peripheral area NAA. The signal lines may be provided for supplying signals provided from the outside to the active area AA, and the driving elements may be provided for driving the active area AA. The peripheral area NAA may be adjacent to a side of the active area AA. In an exemplary embodiment, the peripheral area NAA may have a different shape from that of the active area AA. In the illustrated embodiment, the peripheral area NAA has a frame shape that surrounds the active area AA. However, the inventive concepts are not limited thereto. In another exemplary embodiment, the peripheral area NAA may be omitted from the electronic device EA.

FIG. 2A illustrates a schematic cross-sectional view of an electronic device according to an exemplary embodiment of the present invention. The electronic device EA may include a display panel DP and an input sensing unit SU. The display panel DP may include a base layer BF, a circuit layer ML, a light emitting element layer EL, and an encapsulation substrate ECL.

The base layer BF may include a plastic substrate, a glass substrate, or an organic/inorganic composite substrate. Alternatively, the base layer BF may be a stack structure including a plurality of insulating layers.

The circuit layer ML may be disposed on the base layer BF. The circuit layer ML may include a thin film transistor and a capacitor, which are electrically connected to the light emitting element layer EL. The circuit layer ML may be electrically connected to the light emitting element layer EL to control a light emitting operation of the light emitting element layer EL.

The light emitting element layer EL may display light by electrical signals transmitted through the thin film transistor and the capacitor of the circuit layer ML, thereby displaying an image. The light emitting element layer EL may be disposed on the circuit layer ML. The light emitting element layer EL may include at least one of various exemplary embodiments. For example, the light emitting element layer EL may include an electrophoretic element, a liquid crystal capacitor, an electrowetting element, or an organic light emitting element. In the illustrated embodiment, the light emitting element layer EL including the organic light emitting element will be described as an example.

The encapsulation substrate ECL may encapsulate the light emitting element layer EL. The encapsulation substrate ECL may protect the light emitting element layer EL from a foreign material such as moisture, oxygen and/or dust particles. The encapsulation substrate ECL may be coupled to the base layer BF through a sealing portion LP. In an embodiment, the encapsulation substrate ECL may be provided as a substrate formed of glass or plastic. The sealing portion LP may include a frit. However, the material of the sealing portion LP is not limited thereto.

The input sensing unit SU according to the illustrated embodiment may sense the external input TC provided from the outside.

FIG. 2A illustrates the input sensing unit SU formed directly on the encapsulation substrate ECL. However, the inventive concepts are not limited thereto. In another exemplary embodiment, the input sensing unit SU may be separately provided and may be disposed on the encapsulation substrate ECL. In this case, an adhesive member (not shown) may be provided between the encapsulation substrate ECL and the input sensing unit SU, and the encapsulation substrate ECL and the input sensing unit SU may be coupled to each other by the adhesive member.

Referring to FIG. 2B, an electronic device EA-A may include a display panel DP-A and an input sensing unit SU-A. The display panel DP-A may include a base layer BF-A, a circuit layer ML-A, a light emitting element layer EL-A, and an thin film encapsulation layer TFE. The circuit layer ML-A and the light emitting element layer EL-A of FIG. 2B may be substantially the same as the circuit layer ML and the light emitting element layer EL of FIG. 2A, respectively.

Unlike FIG. 2A, the light emitting element layer EL-A of FIG. 2B may be encapsulated by the thin film encapsulation layer TFE. The thin film encapsulation layer TFE may include at least one insulating layer. The thin film encapsulation layer TFE according to an exemplary embodiment of the present invention may include at least one organic film and at least one inorganic film.

The inorganic film may protect the light emitting element layer EL-A from moisture/oxygen, and the organic film may protect the light emitting element layer EL-A from a foreign material, such as dust particles. The inorganic film may include at least one of, but is not limited to, a silicon nitride layer, a silicon oxynitride layer, a silicon oxide layer, a titanium oxide layer, or an aluminum oxide layer. The organic film may include, but is not limited to, an acrylic-based organic film.

In an exemplary embodiment, the input sensing unit SU-A may be formed directly on the thin film encapsulation layer TFE. Thus, the thin film encapsulation layer TFE and the input sensing unit SU-A may be sequentially formed by continuous processes. However, the inventive concepts are not limited thereto. In another exemplary embodiment, an adhesive member (not shown) may be provided between the input sensing unit SU-A and the thin film encapsulation layer TFE, and the input sensing unit SU-A may be coupled to the thin film encapsulation layer TFE by the adhesive member. The adhesive member may be, but is not limited to, an organic adhesive layer, such as an optically clear adhesive (OCA) film, an optically clear resin (OCR), or a pressure sensitive adhesive (PSA) film.

Referring to FIG. 3, the input sensing unit SU according to an exemplary embodiment of the present invention may include a notch NC corresponding to the recess PC provided at the active area AA. In an exemplary embodiment, the notch NC may include a first side NC-L, a second side NC-M, and a third side NC-R when viewed in a plan view.

The first side NC-L may extend in the first direction DR1. The third side NC-R may extend in the first direction DR1 and may be spaced apart from the first side NC-L in the second direction DR2. The second side NC-M may extend in the second direction DR2 and may be disposed between the first side NC-L and the third side NC-R to connect the first side NC-L and the third side NC-R.

One end of each of the first and third sides NC-L and NC-R, which is connected to the second side NC-M, may have a curved shape, and another end (opposite to the one end) of each of the first and third sides NC-L and NC-R may also have a curved shape. The shape of the notch NC illustrated in FIG. 3 may include a curved line and may be recessed in the first direction DR1, when viewed in a plan view. However, the inventive concepts are not limited thereto. In other exemplary embodiments, the input sensing unit SU may have a regular shape parallel to a plane defined by the first and second directions DR1 and DR2 or may have an irregular shape including a polygonal shape and/or a curved shape.

The input sensing unit SU according to an exemplary embodiment of the present invention may include a sensing area TA and a non-sensing area NTA. The sensing area TA may overlap with the active area AA. In a certain embodiment, the sensing area TA and the non-sensing area NTA may overlap with the active area AA. The sensing area TA may sense the external input TC. The non-sensing area NTA may surround the sensing area TA when viewed in a plan view. An outer contour of the non-sensing area NTA may have substantially the same shape as a contour of the sensing area TA.

The sensing area TA may include a first sensing area SA1, a second sensing area SA2, and a third sensing area SA3. In an exemplary embodiment, the first sensing area SA1 may have a rectangular shape when viewed in a plan view.

The second sensing area SA2 and the third sensing area SA3 may protrude from the first sensing area SA1 in a direction opposite to the first direction DR1.

One of sides defining an edge of the second sensing area SA2, which faces the third sensing area SA3, may correspond to the first side NC-L. In addition, one of sides defining an edge of the third sensing area SA3, which faces the second sensing area SA2, may correspond to the third side NC-R.

In an exemplary embodiment of the present invention, the second and third sensing areas SA2 and SA3 are provided together with the first sensing area SA1. However, the inventive concepts are not limited with regard to the number of the sensing areas protruding from the first sensing area SA1. For example, a single sensing area may protrude from the first sensing area SA1, or three or more sensing areas may protrude from the first sensing area SA1. The electronic module MD may be disposed in an area between the second and third sensing areas SA2 and SA3, i.e., the notch NC.

The shapes of the sensing area TA and the non-sensing area NTA of FIG. 3 correspond to the shape of the active area AA, when viewed in a plan view. However, the inventive concepts are not limited thereto. In another exemplary embodiment, the shapes of the sensing area TA and the non-sensing area NTA may be different from that of the active area AA, when viewed in a plan view.

The input sensing unit SU may include a first electrode SE1, a second electrode SE2, first trace lines SL1 and SL2, second trace lines SL3, a connection trace line ESL, an auxiliary line CL, and pads PD.

The input sensing unit SU according to an exemplary embodiment of the present invention may be disposed on a base member BSM. The base member BSM may correspond to the encapsulation substrate ECL of FIG. 2A or the thin film encapsulation layer TFE of FIG. 2B. Alternatively, the base member BSL may be a component different from the encapsulation substrate ECL and the thin film encapsulation layer TFE. However, the inventive concepts are not limited thereto.

The first electrode SE1 may extend in the first direction DR1. The first electrode SE1 may be provided in plurality, and the plurality of first electrodes SE1 may be arranged in the second direction DR2. The first electrode SE1 may include first patterns SP1 and first connection patterns BSP1.

The first patterns SP1 and the first connection patterns BSP1 may be arranged in the first direction DR1. Each of the first connection patterns BSP1 may be disposed between the first patterns SP1 adjacent to each other. The first patterns SP1 may be electrically connected to each other through the first connection patterns BSP1.

The first patterns SP1 may include normal patterns SNP and notch patterns NSP. The notch patterns NSP may be disposed in the second sensing area SA2 and the third sensing area SA3. In an exemplary embodiment, the notch patterns NSP may be disposed in an area of the second sensing area SA2, which is adjacent to the first side NC-L. In addition, the notch patterns NSP may be disposed in an area of the third sensing area SA3, which is adjacent to the third side NC-R. The notch patterns NSP may include a plurality of patterns having different areas (or sizes) when viewed in a plan view. FIG. 3 illustrates a first notch pattern NSP1 and a second notch pattern NSP2, areas of which are different from each other. For example, the area of the first notch pattern NSP1 may be less than the area of the second notch pattern NSP2. The first notch pattern NSP1 and the second notch pattern NSP2 may be connected to each other through the first connection pattern BSP1.

According to an exemplary embodiment of the present invention, the areas of the notch patterns NSP may be less than those of the normal patterns SNP when viewed in a plan view. The notch patterns NSP may be formed in a process of forming the notch NC of the input sensing unit SU. Thus, the notch patterns NSP may have shapes formed by removing portions of the normal patterns SNP in a plan view.

The normal patterns SNP may be disposed in the sensing area TA. In more detail, the normal patterns SNP may be disposed in the first sensing area SA1 and portions of the second and third sensing areas SA2 and SA3. Adjacent two of the normal patterns SNP may be connected to each other through the first connection pattern BSP1. In addition, the normal pattern SNP and the notch pattern NSP which are adjacent to each other may be connected to each other through the first connection pattern BSP1. For example, in FIG. 3, the normal pattern SNP overlapping with a boundary of the first and third sensing areas SA1 and SA3 is connected to the second notch pattern NSP2 through the first connection pattern BSP1. Portions of the normal patterns SNP adjacent to a boundary of the sensing area TA and the non-sensing area NTA may be removed.

In an exemplary embodiment, the normal patterns SNP and the notch patterns NSP may include a transparent conductive oxide. For example, the normal patterns SNP and the notch patterns NSP may include at least one of indium zinc oxide (IZO), indium tin oxide (ITO), indium gallium oxide (IGO), indium zinc gallium oxide (IGZO), or any mixture/compound thereof. However, the inventive concepts are not limited thereto. In another exemplary embodiment, the normal patterns SNP and the notch patterns NSP may include a metal material such as molybdenum, silver, titanium, copper, aluminum, or any alloy thereof. In this case, the normal patterns SNP and the notch patterns NSP may have a metal mesh structure to inhibit the patterns from being visible to the outside.

In FIG. 3, a first column electrode T1 and a second column electrode T2 of the first electrodes SE1 are shaded differently from each other for the purpose of ease and convenience in description and illustration.

The first column electrode T1 may include the normal patterns SNP, the notch patterns NSP, and the first connection patterns BSP1. The first column electrode T1 may be defined as a column in which the normal patterns SNP, the notch patterns NSP and the first connection patterns BSP1 are arranged in the first direction DR1. For example, the first column electrode T1 may be adjacent to each of the first and third sides NC-L and NC-R.

The second column electrode T2 may include the normal patterns SNP and the first connection patterns BSP1. The second column electrode T2 may be defined as a column in which the normal patterns SNP and the first connection patterns BSP1 are arranged in the first direction DR1.

The first trace lines SL1 and SL2 may be connected to the second column electrode T2 corresponding thereto. For example, an upper trace line SL1 of the first trace lines SL1 and SL2 may be connected to the normal pattern SNP disposed at one end of the second column electrode T2. A lower trace line SL2 of the first trace lines SL1 and SL2 may be connected to the normal pattern SNP disposed at another end of the second column electrode T2. However, the inventive concepts are not limited thereto. In another exemplary embodiment, one of the upper and lower trace lines SL1 and SL2 may be omitted.

The second electrode SE2 may extend in the second direction DR2. The second electrode SE2 may be provided in plurality, and the plurality of second electrodes SE2 may be arranged in the first direction DR1. The second electrode SE2 may include second patterns SP2 (hereinafter, referred to as 'sensor patterns') and second connection patterns BSP2. The sensor patterns SP2 may be spaced apart from the first patterns SP1 when viewed in a plan view.

The sensor patterns SP2 and the second connection patterns BSP2 may be arranged in the second direction DR2. Each of the second connection patterns BSP2 may be disposed between the sensor patterns SP2 adjacent to each other. The sensor patterns SP2 may be electrically connected to each other through the second connection patterns BSP2. The sensor patterns SP2 may include the same material as the first patterns SP1.

The first trace lines SL1 and SL2 may be disposed in the non-sensing area NTA. Each of the first trace lines SL1 and SL2 may be connected to a corresponding one of the pads PD.

The first trace lines SL1 and SL2 may connect the second column electrode T2 to the corresponding pad(s). Each of the first trace lines SL1 and SL2 may transmit an electrical signal provided through the corresponding pad to the second column electrode T2 and/or may transmit an electrical signal provided from the second column electrode T2 to the outside through the corresponding pad.

In the present exemplary embodiment, the upper trace line SL1 may include a plurality of lines, each of which is connected to the normal pattern disposed at one end of each of a plurality of the second column electrodes. The lower trace line SL2 may include a plurality of lines, each of which is connected to the normal pattern disposed at another end of each of the plurality of second column electrodes.

The second trace lines SL3 may be disposed in the non-sensing area NTA. The second trace lines SL3 may be connected to the pads PD corresponding to the second electrodes SE2. Each of the second trace lines SL3 may transmit an electrical signal provided through the corresponding pad to the second electrode SE2 and/or may transmit an electrical signal provided from the second electrode SE2 to the outside through the corresponding pad.

The connection trace line ESL may be spaced apart from the first trace lines SL1 and SL2. The connection trace line ESL may be connected to the first column electrode T1. The connection trace line ESL may be connected to at least two of the notch patterns NSP. For example, the connection trace line ESL may be connected to the first notch pattern NSP1 of the first column electrode T1. In addition, the connection trace line ESL may also be connected to the second notch pattern NSP2 adjacent to the first notch pattern NSP1.

The connection trace line ESL may be connected to a corresponding one of the pads PD. Thus, the connection trace line ESL may connect the first column electrode T1 to the corresponding pad. The connection trace line ESL may transmit an electrical signal provided through the corresponding pad to the first column electrode T1 and/or may transmit an electrical signal provided from the first column electrode T1 to the outside through the corresponding pad.

A single connection trace line ESL is illustrated in FIG. 3. However, the inventive concepts are not limited thereto. In another exemplary embodiment, the first column electrode T1 may be provided in plurality.

According to an exemplary embodiment of the present invention, the notch patterns NSP, of which portions are removed, may be connected to the pad PD and/or other component through the connection trace line ESL, and thus, touch sensitivity of electronic devices having various shapes and areas may be substantially uniform.

The auxiliary line CL may connect the sensor patterns SP2. For example, the auxiliary line CL may connect the sensor patterns SP2 which are supplied with the same signal and are separated from each other by the notch NC. In FIG. 3, the auxiliary line CL connects one sensor pattern of the second sensing area SA2 to one sensor pattern of the third sensing area SA3. However, the inventive concepts are not limited thereto. The auxiliary line CL may be provided in plurality when a plurality of the second electrodes SE2 are cut by the notch NC.

Figure 4A:
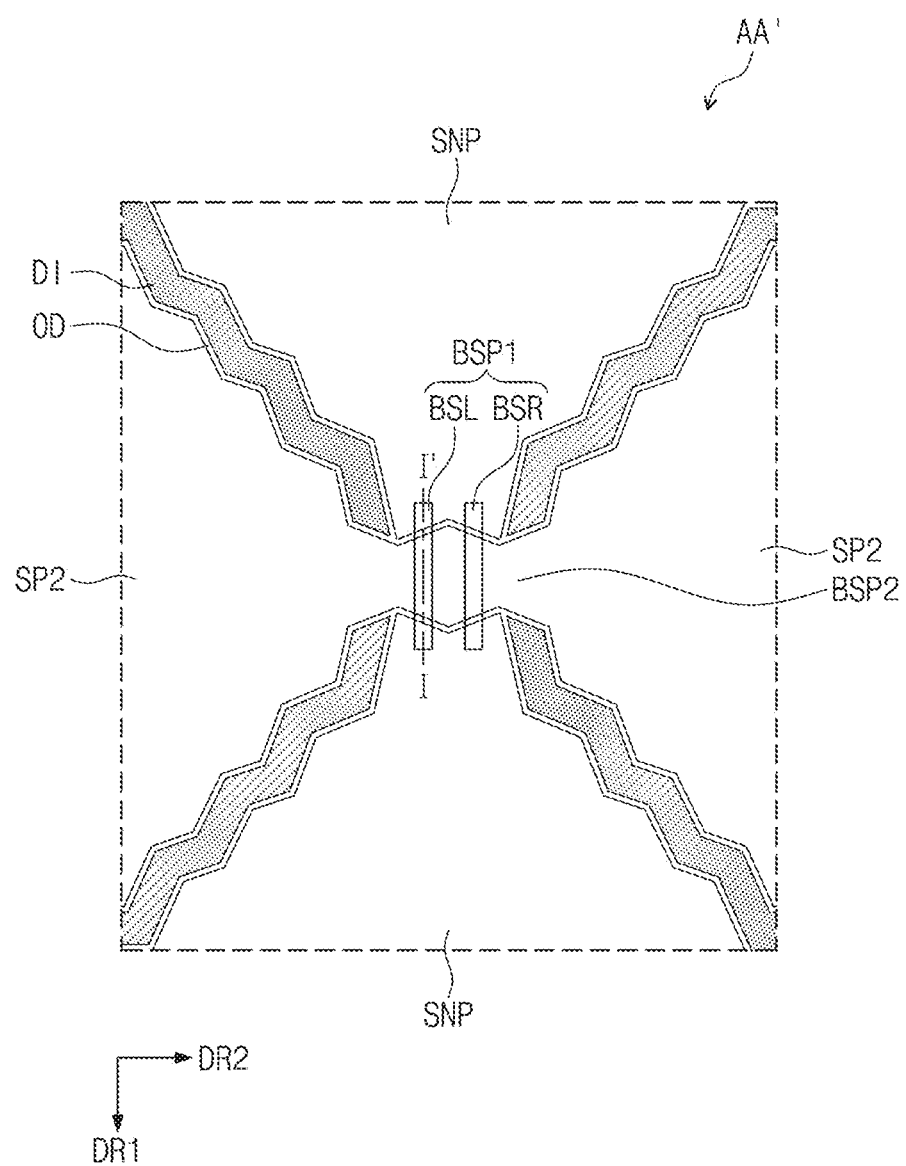
FIG. 4A is an enlarged plan view of an area AA' of FIG. 3.
Figure 4B:
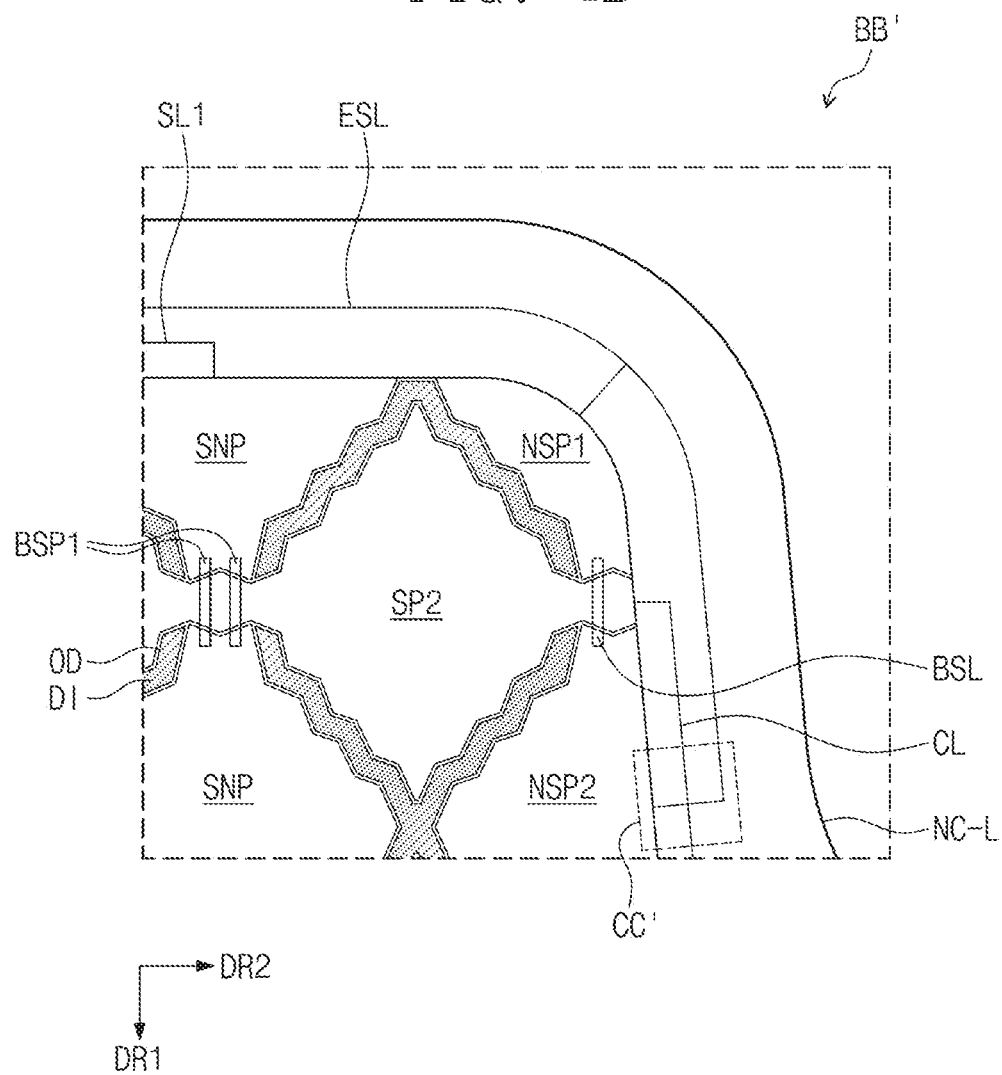
FIG. 4B is an enlarged plan view of an area BB' of FIG. 3.
Figure 4C:
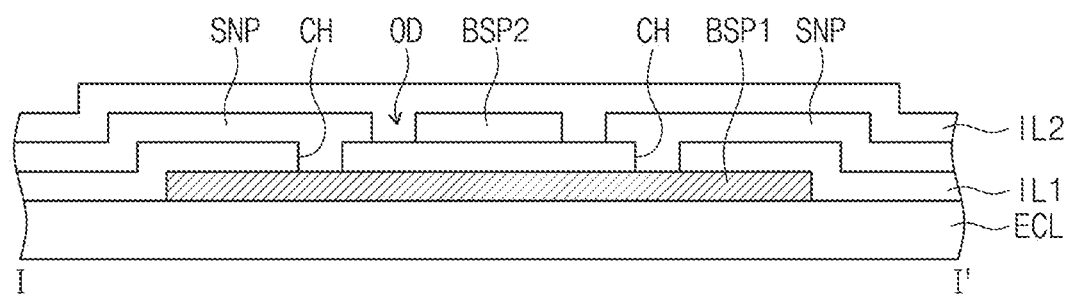
FIG. 4C is a cross-sectional view taken along a line I-I' of FIG. 4A.

FIG. 4A is an enlarged plan view of an area AA' of FIG. 3. FIG. 4B is an enlarged plan view of an area BB' of FIG. 3. FIG. 4C is a cross-sectional view taken along a line I-I' of FIG. 4A. Hereinafter, the same components as described with reference to FIGS. 1 to 3 will be indicated by the same reference designators, and the descriptions thereof will be omitted.

In FIG. 4A, two normal patterns SNP and the first connection pattern BSP1 connecting the two normal patterns SNP are illustrated as a portion of the first electrode SE1 (see FIG. 3). In addition, in FIG. 4A, two sensor patterns SP2 and the second connection pattern BSP2 connecting the two sensor patterns SP are illustrated as a portion of the second electrode SE2 (see FIG. 3). FIG. 4C illustrates a cross-sectional view of a portion of the first connection pattern BSP1.

According to an exemplary embodiment, an area illustrated in FIG. 4A may be defined as a node for sensing a capacitance of the input sensing unit SU. In this case, the node may include a first node defined by the normal patterns SNP and the first connection pattern BSP1 and a second node defined by the sensor patterns SP2 and the second connection pattern BSP2 in the area AA'.

In an exemplary embodiment, the first connection pattern BSP1 may include a first branch portion BSL and a second branch portion BSR. The first branch portion BSL and the second branch portion BSR may be spaced apart from each other in the second direction DR2. Each of the first and second branch portions BSL and BSR may extend in the first direction DR1. The first connection pattern BSP1 may overlap with the second connection pattern BSP2 when viewed in a plan view.

Referring to FIG. 4C, the first connection pattern BSP1 may be disposed on the encapsulation substrate ECL (hereinafter, referred to as the base member ECL). The first connection pattern BSP1 may be covered by a first insulating layer IL1 including a plurality of contact holes CH.

The normal patterns SNP and the second connection pattern BSP2 may be disposed on the first insulating layer IL1. The contact holes CH may expose portions of the first connection pattern BSP1. The normal patterns SNP spaced apart from each other may be connected to the portions of the first connection pattern BSP1 exposed by the contact holes CH.

The second connection pattern BSP2 may be disposed between the normal patterns SNP spaced apart from each other. The second connection pattern BSP2 may be spaced apart from the normal patterns SNP. The second connection pattern BSP2 and the normal patterns SNP may be covered by a second insulating layer IL2.

In an exemplary embodiment, the normal patterns SNP and the sensor patterns SP2 may be disposed on the same layer. In addition, the first connection pattern BSP1 may be disposed on a layer different from the layer on which the normal patterns SNP (i.e., the first patterns SP1) and the sensor patterns SP2 are disposed. In FIG. 4C, the first connection pattern BSP1 is disposed under the normal patterns SNP. However, the inventive concepts are not limited thereto. In another exemplary embodiment, the first connection pattern BSP1 may be disposed on the normal patterns SNP with an insulating layer interposed therebetween.

According to an exemplary embodiment, a dummy pattern DI may be disposed between the sensor patterns SP2 when viewed in a plan view. In an exemplary embodiment, the dummy patterns DI may be disposed at boundaries of the sensor patterns SP2 and the normal patterns SNP. A separation space OD may be defined between the dummy pattern DI and the sensor pattern SP2 and between the dummy pattern DI and the normal pattern SNP. Thus, the dummy pattern DI may be a floating pattern spaced apart from the sensor pattern SP2 and the normal pattern NSP.

The dummy pattern DI may be disposed on the same layer as the sensor patterns SP2 and the normal patterns SNP and may include the same material as the sensor patterns SP2 and the normal patterns SNP.

FIG. 4A illustrates the dummy pattern DI having a stepped shape in a plan view. However, the inventive concepts are not limited thereto. In another exemplary embodiment, the dummy pattern DI may have a straight line shape or a groove shape in a plan view.

In FIG. 4A, a single dummy pattern DI is disposed between the sensor pattern SP2 and the normal pattern SNP adjacent to each other. However, the inventive concepts are not limited thereto. In another exemplary embodiment, a plurality of the dummy patterns spaced apart from each other may be disposed between the sensor pattern SP2 and the normal pattern SNP adjacent to each other. In an exemplary embodiment, the dummy pattern DI may also be applied between the electrodes SE1 and SE2.

According to the exemplary embodiment of the present invention, the dummy pattern DI may be disposed between the electrodes SE1 and SE2, and thus, it is possible to prevent the patterns SP1 and SP2 of the electrodes SE1 and SE2 from being visible to the outside. In addition, the dummy pattern DI may have the stepped or groove shape, and thus, an area (or size) for sensing the external input TC (see FIG. 1) may be increased in a limited area. As a result, the touch sensitivity of the input sensing unit SU may be improved.

In FIG. 4B, the first notch pattern NSP1, the second notch pattern NSP2, and the first branch portion BSL connecting the first and second notch patterns NSP1 and NSP2 are illustrated as a portion of the first electrode SE1. In addition, in FIG. 4B, one sensor pattern SP2 and the second connection pattern BSP2 are illustrated as a portion of the second electrode SE2.

The first notch pattern NSP1 and the second notch pattern NSP2 may be disposed in an area adjacent to the first side NC-L. In an exemplary embodiment, the first notch pattern NSP1 and the second notch pattern NSP2 may be electrically connected to each other through the first branch portion BSL.

The connection pattern connecting the first and second notch patterns NSP1 and NSP2 may be a single pattern (i.e., the first branch portion BSL), unlike the first connection pattern BSP1, which connects the normal patterns SNP. This may be because a portion of a plurality of patterns of the first connection pattern BSP1 is removed in a process of forming the notch NC. In addition, each of the notch patterns NSP may be formed by removing a portion of the normal pattern overlapping with the first side NC-L in the process of forming the notch NC.

Thus, the first notch pattern NSP1 and the second notch pattern NSP2 may be electrically connected to each other through only the first branch portion BSL.

In this case, the first branch portion BSL may be damaged by electrostatic discharge occurring at the notch NC. The first notch pattern NSP1 and the second notch pattern NSP2 may be disconnected from each other by the damage of the first branch portion BSL, and thus, touch sensitivity of the area adjacent to the notch NC may be reduced.

However, according to an exemplary embodiment of the present invention, the connection trace line ESL may connect the first notch pattern NSP1 and the second notch pattern NSP2 to each other. In other words, the connection trace line ESL may connect the notch patterns NSP1 and NSP2 connected to each other through only the first branch portion BSL. A portion of the connection trace line ESL may overlap with the auxiliary line CL when viewed in a plan view.

Since the connection trace line ESL connects the notch patterns NSP1 and NSP2 connected to each other through only the first branch portion BSL, the touch sensitivity in the area adjacent to the notch NC may be uniformly maintained. As a result, the touch sensitivity of the electronic device may be improved.

Figure 5A:
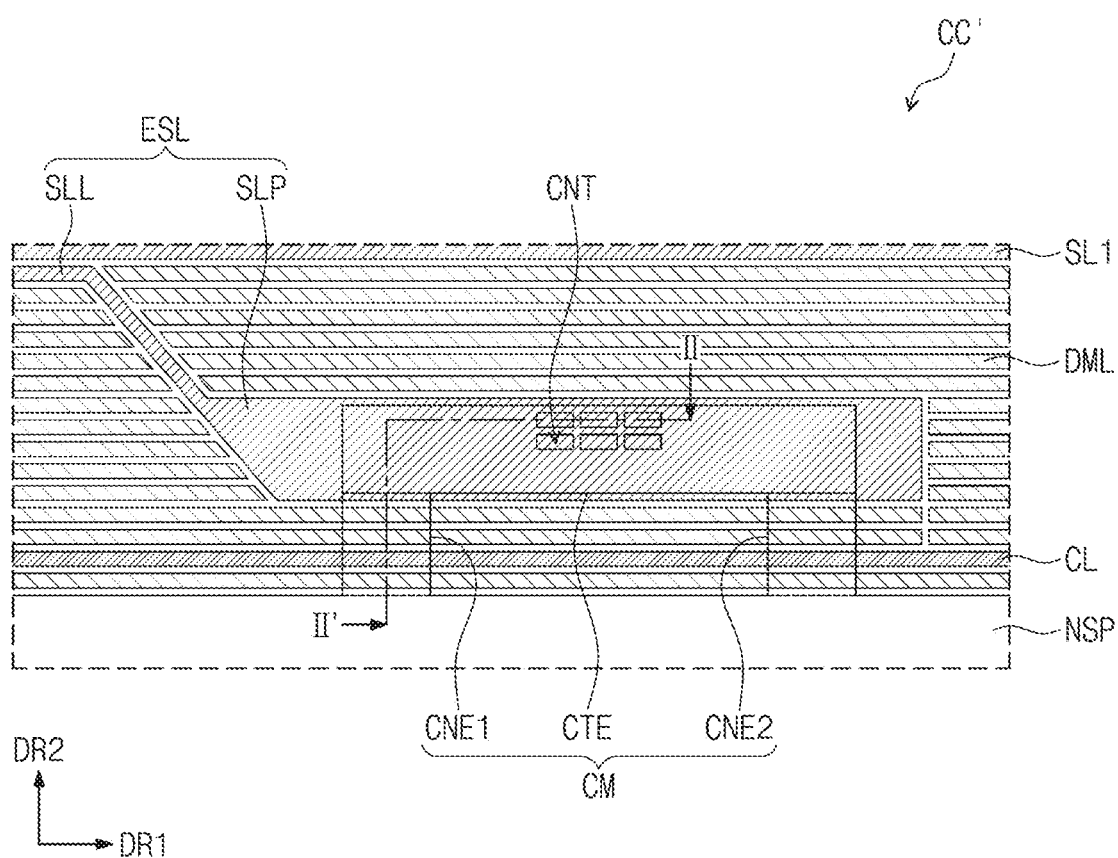
FIG. 5A is an enlarged plan view of an area CC' of FIG. 4B.
Figure 5B:
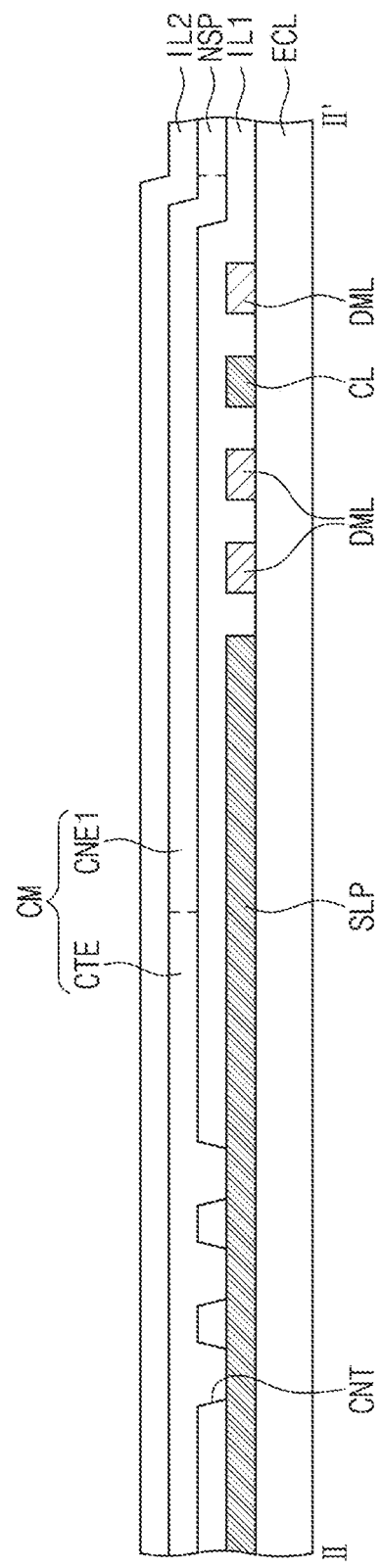
FIG. 5B is a cross-sectional view taken along a line II-IF of FIG. 5A.

FIG. 5A is an enlarged plan view of an area CC' of FIG. 4B. FIG. 5B is a cross-sectional view taken along a line II-IF of FIG. 5A. Hereinafter, connection relationship between the connection trace line ESL and the notch patterns NSP will be described with reference to FIGS. 5A and 5B.

Referring to FIG. 5A, in an exemplary embodiment, the notch pattern NSP may further include a connection portion CM. The connection portion CM may include a first connection portion CNE1, a second connection portion CNE2, and a contact portion CTE.

The first connection portion CNE1 and the second connection portion CNE2 may extend in a direction toward the non-sensing area NTA (see FIG. 3). For example, the first and second connection portions CNE1 and CNE2 may extend in the second direction DR2. The first connection portion CNE1 and the second connection portion CNE2 may be spaced apart from each other in the first direction DR1. The first connection portion CNE1 and the second connection portion CNE2 may be electrically connected to each other by the contact portion CTE.

The connection trace line ESL may include a line portion SLL and a pad portion SLP. The line portion SLL may extend in a direction which intersects the first direction DR1 and a direction opposite to the second direction DR2. The pad portion SLP may extend in the first direction DR1 and may be connected to the line portion SLL.

The pad portion SLP may overlap with the contact portion CTE when viewed in a plan view. The pad portion SLP and the contact portion CTE may be connected to each other through a contact hole CNT. The connection trace line ESL and the auxiliary line CL may extend in the first direction DR1 and may be spaced apart from each other in the second direction DR2.

According to an exemplary embodiment, a guard line DML may be disposed between the connection trace line ESL and the auxiliary line CL. The guard line DML may be a line to which a signal is not provided. Thus, the connection trace line ESL may be electrically insulated from the auxiliary line CL.

The guard lines DML may surround an area in which the contact hole CNT is formed, when viewed in a plan view. The guard lines DML may be provided in a floating state. Since the guard line DML is disposed between lines transmitting/receiving different signals, the lines may not affect each other. However, the inventive concepts are not limited thereto. In another exemplary embodiment, an electrical signal may be provided to the guard line DML to enhance voltages of lines adjacent to the guard line DML.

FIG. 5A illustrates the first connection portion CNE1 and the second connection portion CNE2 which protrude into the non-sensing area NTA. However, the inventive concepts are not limited thereto. In another exemplary embodiment, a single connection portion may be provided or three or more connection portions may be provided. In addition, the contact holes CNT are provided in a 2×3 matrix form in FIG. 5A. Alternatively, the arrangement of the contact holes CNT for connecting the contact portion CTE and the connection trace line ESL may be variously modified.

In the present exemplary embodiment, the connection relationship between the connection trace line ESL and the notch pattern NSP is described. However, the exemplary embodiment described with reference to FIG. 5A may be substantially applied to areas in which the first and second trace lines SL (see FIG. 3) are connected to the normal patterns SNP (see FIG. 3) and the sensor patterns SP2 (see FIG. 3).

Referring to FIG. 5B, the pad portion SLP, the guard line DML, and the auxiliary line CL may be disposed on the base member ECL when viewed in a cross-sectional view. The pad portion SLP, the guard line DML and the auxiliary line CL may be formed by the same process. The first insulating layer IL1 including the contact hole CNT may be disposed on the base member ECL.

In an exemplary embodiment, the contact portion CTE may be connected to the pad portion SLP through the contact hole CNT. The connection portion CM and the notch pattern NSP may be disposed on the first insulating layer IL1 and may be covered by the second insulating layer IL2.

The contact hole CNT may overlap with the contact portion CTE in a plan view and may be spaced apart from the first and second connection portions CNE1 and CNE2 in a plan view. Thus, even though a portion of the first insulating layer IL1 adjacent to the contact hole CNT may be damaged, it is possible to prevent a short between the connection portions CNE1 and CNE2 and a line (e.g., the auxiliary line CL) disposed under the connection portions CNE1 and CNE2.

Figure 6A:
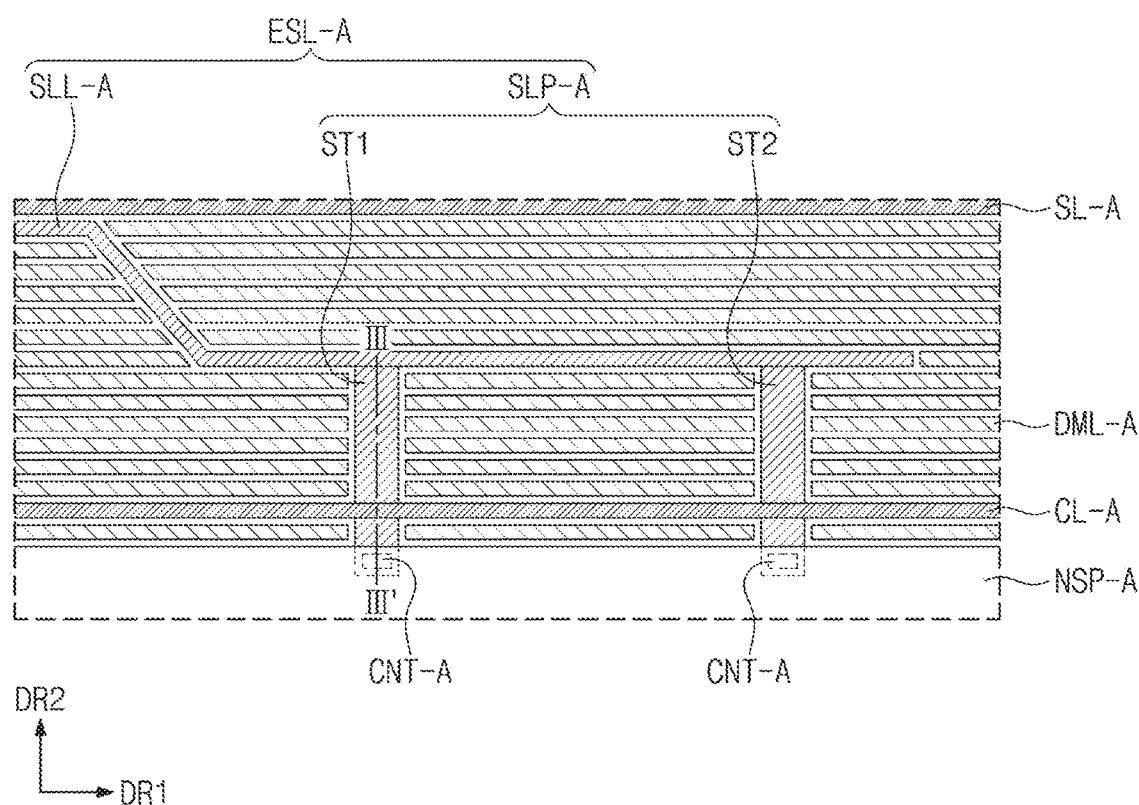
FIG. 6A is an enlarged plan view illustrating a portion of an input sensing unit according to an exemplary embodiment of the present invention.
Figure 6B:
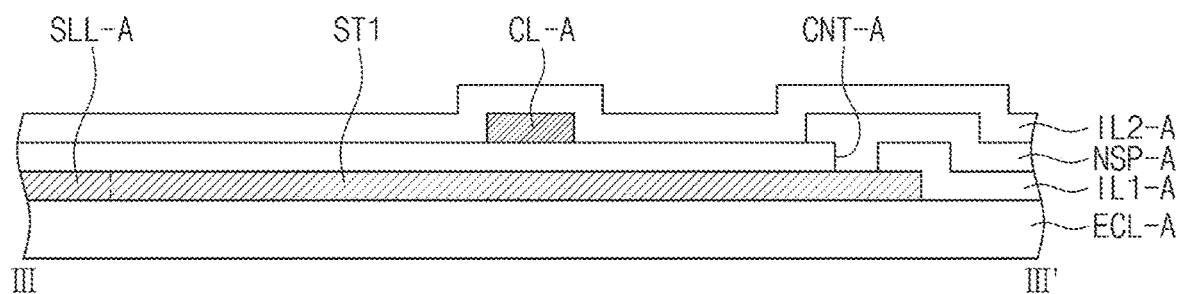
FIG. 6B is a cross-sectional view taken along a line of FIG. 6A.

FIG. 6A is an enlarged plan view illustrating a portion of an input sensing unit according to an exemplary embodiment of the present invention, and FIG. 6B is a cross-sectional view taken along a line of FIG. 6A. Hereinafter, components similar to those of FIGS. 5A and 5B will be indicated by similar reference designators, and the descriptions to the same features as mentioned above will be omitted.

A connection trace line ESL-A and a notch pattern NSP-A of FIGS. 6A and 6B may be electrically connected to each other through an additional pattern SLP-A included in the connection trace line ESL-A, unlike the exemplary embodiment of FIGS. 5A and 5B.

Referring to FIG. 6A, the connection trace line ESL-A may further include the additional pattern SLP-A. The additional pattern SLP-A may include a first additional pattern ST1 and a second additional pattern ST2. The additional pattern SLP-A may extend in a direction toward the notch pattern NSP-A. For example, the additional pattern SLP-A may extend in a direction opposite to the second direction DR2. The first additional pattern ST1 and the second additional pattern ST2 may be spaced apart from each other in the first direction DR1. Each of the first and second additional patterns ST1 and ST2 may be connected to the notch pattern NSP-A through a contact hole CNT-A.

According to an exemplary embodiment, a portion of the additional pattern SLP-A may overlap with an auxiliary line CL-A when viewed in a plan view. The extending direction of the additional pattern SLP-A may intersect an extending direction of the auxiliary line CL-A. Reference designators SL-A and DML-A may represent a first trace line and a guard line, respectively.

Referring to FIG. 6B, a line portion SLL-A and the first additional pattern ST1 may be disposed on a base member ECL-A when viewed in a cross-sectional view. A first insulating layer IL1-A including the contact hole CNT-A may be disposed on the base member ECL-A. The auxiliary line CL-A may be disposed on a layer different from a layer on which the connection trace line ESL-A is disposed.

The notch pattern NSP-A according to the present embodiment may be connected to the first additional pattern ST1 through the contact hole CNT-A. The auxiliary line CL-A and the notch pattern NSP-A may be disposed on the first insulating layer IL1-A and may be covered by a second insulating layer IL2-A. Thus, the auxiliary line CL-A and the notch pattern NSP-A may be disposed on the same layer.

Figure 7A:
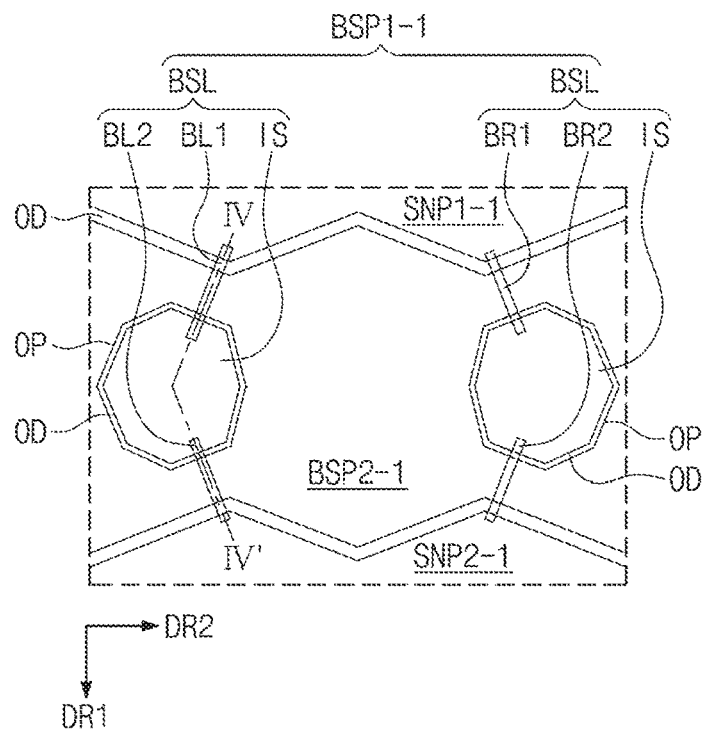
FIG. 7A and FIG. 7B are enlarged plan views illustrating portions of an input sensing unit according to an exemplary embodiment of the present invention.
Figure 7B:
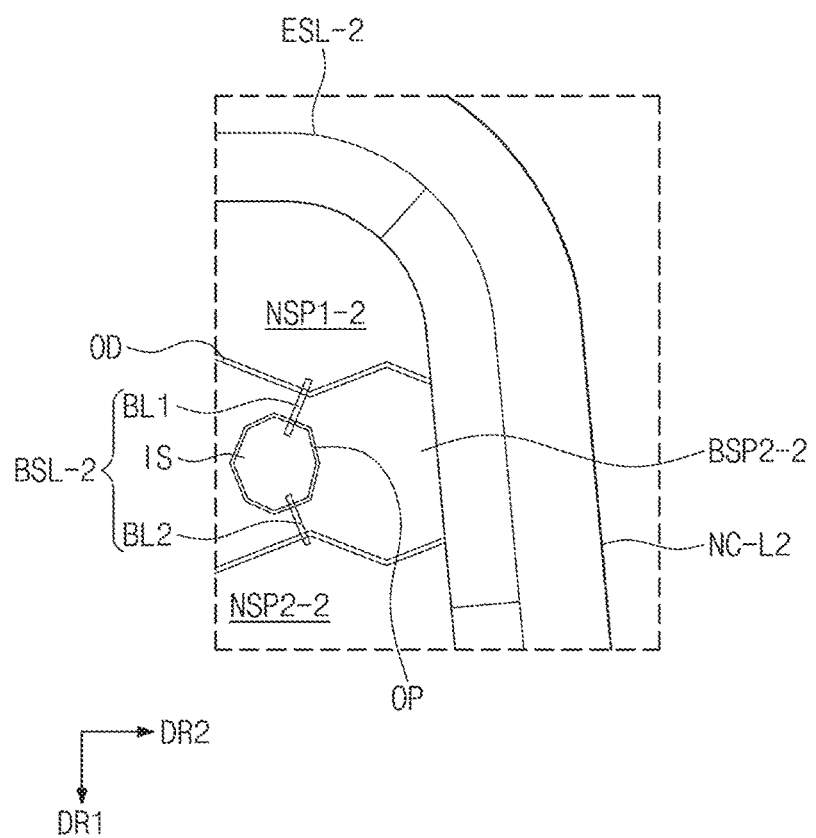
Figure 7C:
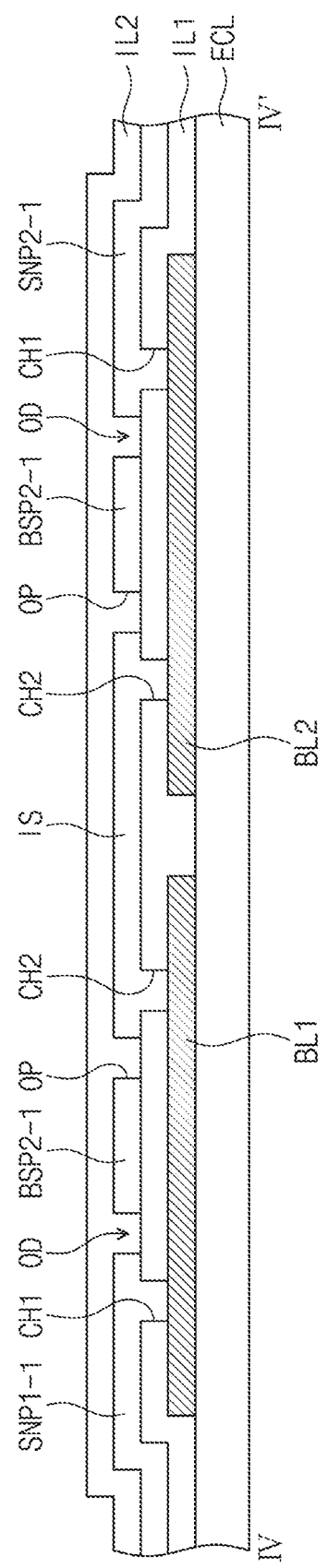
FIG. 7C is a cross-sectional view taken along a line IV-IV' of FIG. 7A.

FIGS. 7A and 7B are enlarged plan views illustrating portions of an input sensing unit according to an exemplary embodiment of the present invention. FIG. 7C is a cross-sectional view taken along a line IV-IV' of FIG. 7A. Hereinafter, similar components to those of FIGS. 1 to 6B will be indicated by similar reference designators, and the descriptions to the same features as mentioned above will be omitted.

Referring to FIG. 7A, a first connection pattern BSP1-1 may include island patterns IS, a first branch portion BSL, and a second branch portion BSR. The island pattern IS may be disposed between normal patterns SNP1-1 and SNP2-1 spaced apart from each other. The island pattern IS may be disposed in an opening OP included in a second connection pattern BSP2-1. A separation space OD may be defined between a sidewall of the island pattern IS and a sidewall of the opening OP. Thus, the island pattern IS may be disposed in a floating form, and the second connection pattern BSP2-1 may not electrically interfere with the island pattern IS.

The first branch portion BSL may include a first branch pattern BL1 and a second branch pattern BL2. The second branch portion BSR may include a third branch pattern BR1 and a fourth branch pattern BR2. The first branch portion BSL and the second branch portion BSR may be spaced apart from each other in the second direction DR2.

The first branch pattern BL1 and the third branch pattern BR1 may be connected to an upper normal pattern SNP1-1. The second branch pattern BL2 and the fourth branch pattern BR2 may be connected to a lower normal pattern SNP2-1. Thus, the normal patterns SNP1-1 and SNP2-1 spaced apart from each other may be electrically connected to each other by the first branch portion BSL and the second branch portion BSR.

Referring to FIG. 7C, the branch patterns BL1 and BL2 may be disposed on a base member ECL. A first insulating layer IL1 including contact holes CH1 and CH2 may be disposed on the base member ECL.

The upper normal pattern SNP1-1, the second connection pattern BSP2-1, the island pattern IS, and the lower normal pattern SNP2-1 may be disposed on the first insulating layer IL1.

The upper normal pattern SNP1-1 may be connected to the first branch pattern BL1 through one of first contact holes CH1. The lower normal pattern SNP2-1 may be connected to the second branch pattern BL2 through another one of the first contact holes CH1. The branch patterns BL1 and BL2 may be connected to the island pattern IS through second contact holes CH2 and may be connected to each other through the island pattern IS. Thus, the upper and lower normal patterns SNP1-1 and SNP2-1 may be electrically connected to each other through the first connection pattern BSP1-1.

FIG. 7C illustrates the branch patterns BL1 and BL2 spaced apart from each other. However, the inventive concepts are not limited thereto. In another exemplary embodiment, the first and second branch patterns BL1 and BL2 may constitute a substantially single pattern.

Since the first connection pattern BSP1-1 according to the present exemplary embodiment includes a plurality of the branch patterns BL1, BL2, BR1 and BR2, a channel resistance and signal delay thereby may be reduced. As a result, an operating speed of the input sensing unit may be improved and reliability of the electronic device may be improved.

Referring to FIG. 7B, an upper notch pattern NSP1-2 and a lower notch pattern NSP2-2, which are adjacent to a first side NC-L2, may be connected to each other through only a first branch portion BSL-2. The second branch portion BSR of FIG. 7A may be removed in the process of forming the notch NC (see FIG. 3).

According to an exemplary embodiment of the present invention, a connection trace line ESL-2 may be connected to the upper and lower notch patterns NSP1-2 and NSP2-2 to complement sensing characteristics of the notch patterns NSP1-2 and NSP2-2 connected to each other through only the first branch portion BSL-2. Thus, even though a portion of the electrode is removed, the touch sensitivity of the electronic device may be substantially uniform.

Figure 8A:
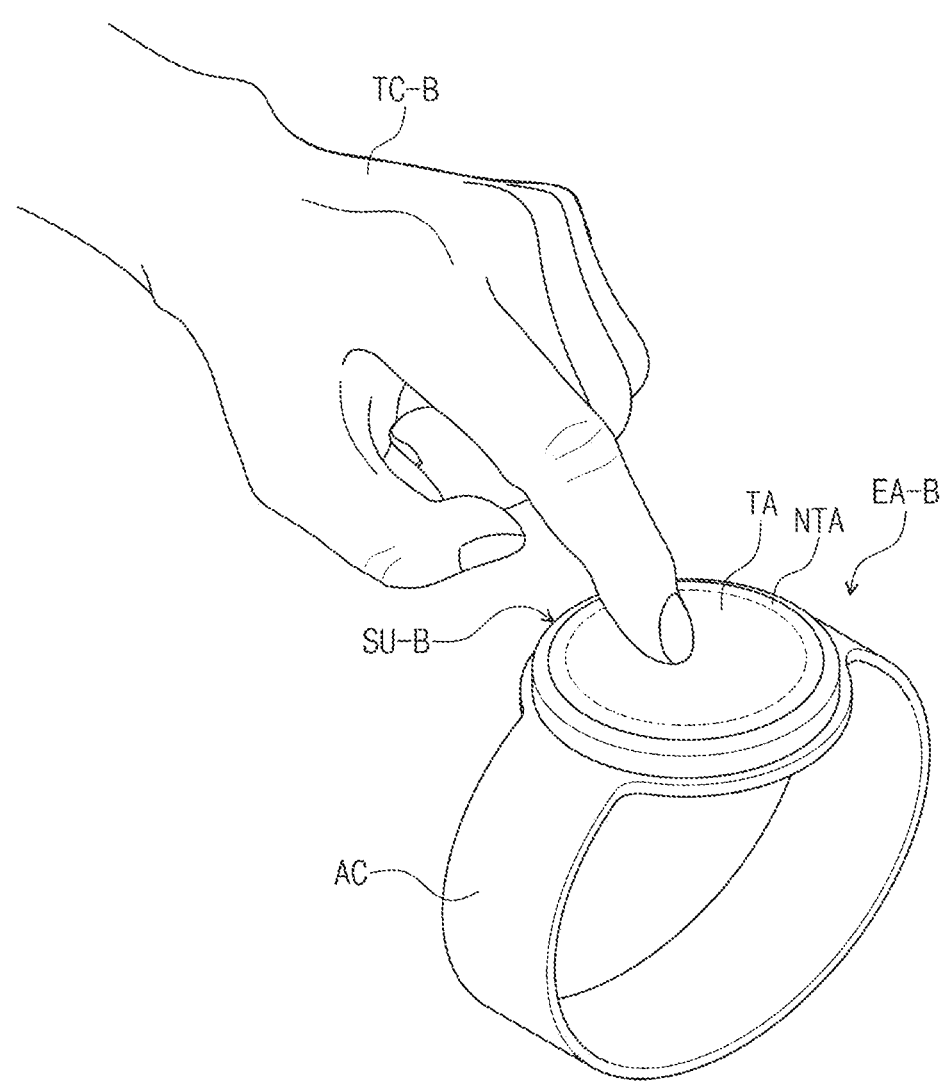
FIG. 8A is a perspective view illustrating an electronic device according to an exemplary embodiment of the present invention.
Figure 8B:
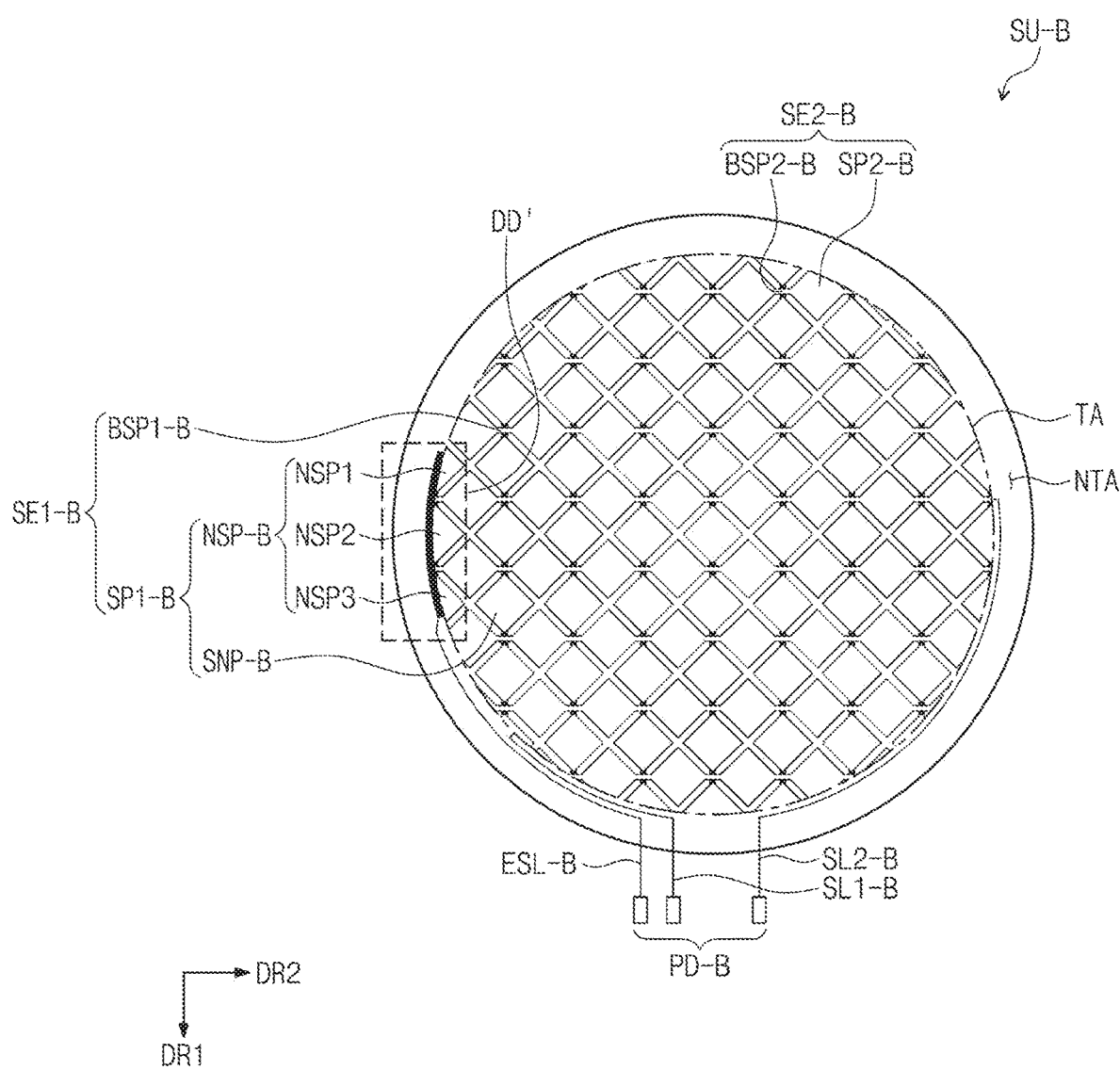
FIG. 8B is a plan view illustrating an electronic device according to an exemplary embodiment of the present invention.

FIG. 8A is a perspective view illustrating an electronic device according to an exemplary embodiment of the present invention. FIG. 8B is a plan view illustrating an electronic device according to an exemplary embodiment of the present invention. The present exemplary embodiment may be applied to the exemplary embodiments described above with reference to FIGS. 2A to 7C. Hereinafter, the same or similar components as described with reference to FIGS. 1 to 7C will be indicated by the same or similar reference designators, and the descriptions to the same features as mentioned above will be omitted.

Referring to FIG. 8A, an electronic device EA-B according to the present exemplary embodiment may include an input sensing unit SU-B and an additional unit AC. The input sensing unit SU-B may include a sensing area TA and a non-sensing area NTA.

A sensing area TA having a substantially circular shape is illustrated in FIG. 8A. However, the inventive concepts are not limited thereto. In another exemplary embodiment, the sensing area TA may have at least one of other various curved shapes, such as an elliptical shape and a semicircular shape.

The non-sensing area NTA may surround the sensing area TA when viewed in a plan view. Since the sensing area TA according to the present exemplary embodiment has a circular shape, the non-sensing area NTA may have a ring shape. However, the inventive concepts are not limited thereto. In another exemplary embodiment, the non-sensing area NTA may have at least one of other various shapes adjacent to at least one side of the sensing area TA.

The additional unit AC may be physically connected to the input sensing unit SU-B. The input sensing unit SU-B may be fixed to another part or body by using the additional unit AC. In the present exemplary embodiment, the additional unit AC may be worn on the body of a user in a band type to fix the input sensing unit SU-B. In an exemplary embodiment, the additional unit AC may receive additional components (e.g., a driving circuit and/or a power source) for driving the input sensing unit SU-B. However, the inventive concepts are not limited thereto. In another exemplary embodiment, the additional unit AC may be omitted from the electronic device EA-B.

Referring to FIG. 8B, the input sensing unit SU-B according to an exemplary embodiment of the present invention may include first electrodes SE1-B, second electrodes SE2-B, first trace lines SL1-B, second trace lines SL2-B, a connection trace line ESL-B, and pads PD-B.

The first electrodes SE1-B may extend in a first direction DR1 and may be arranged in a second direction DR2. The first electrode SE1-B may include first patterns SP1-B and first connection patterns BSP1-B. The first patterns SP1-B may include normal patterns SNP-B and notch patterns NSP-B. The notch patterns NSP-B may include a first notch pattern NSP1, a second notch pattern NSP2, and a third notch pattern NSP3.

The second electrode SE2-B may include second patterns SP2-B and second connection patterns BSP2-B. The second electrode SE2-B, the first trace lines SL1-B, the second trace lines SL2-B and the pads PD-B of the present exemplary embodiment may be substantially the same as the second electrode SE2, the first trace lines SL1, the second trace lines SL3 and the pads PD of FIG. 3, respectively. The auxiliary line CL of FIG. 3 may be omitted in the input sensing unit SU-B according to the present exemplary embodiment.

The notch patterns NSP-B according to an exemplary embodiment of the present invention may be defined as patterns which are connected to each other through a single branch portion by removal of one of the branch portions BSL and BSR constituting the first connection pattern BSP1, as illustrated in FIGS. 4A and 4B. For example, the notch patterns NSP-B may be formed in a process of forming the input sensing unit SU-B in a circular shape.

The connection trace line ESL-B according to the present exemplary embodiment may be connected to three notch patterns NSP-B, unlike the connection trace line ESL illustrated in FIG. 3.

The connection trace line ESL-B may be spaced apart from the first trace line SL1-B. The connection trace line ESL-B may have a curved line to correspond to the circular shape of the sensing area TA.

The connection trace line ESL-B may be connected to the notch patterns NSP-B. For example, the connection trace line ESL-B may be connected to the first notch pattern NSP1, the second notch pattern NSP2, and the third notch pattern NSP3. The connection trace line ESL-B may extend in substantially the same direction as the first connection pattern BSP1-B.

In the present exemplary embodiment, the connection trace line ESL-B is connected to the three notch patterns NSP-B. However, the inventive concepts are not limited thereto. In another exemplary embodiment, the connection trace line ESL-B may be connected to four or more notch patterns, depending on the shape of the input sensing unit SU-B.

FIGS. 9A to 9D are plan views illustrating input sensing units according to other embodiments of the present invention. FIGS. 9A to 9D are enlarged views of an area DD' illustrated in FIG. 8B. The present exemplary embodiment may be applied to the exemplary embodiments described with reference to FIGS. 5A to 6B. Hereinafter, components similar to those of FIGS. 1 to 7C will be indicated by similar reference designators, and the descriptions to the same features mentioned above will be omitted.

Figure 9A:
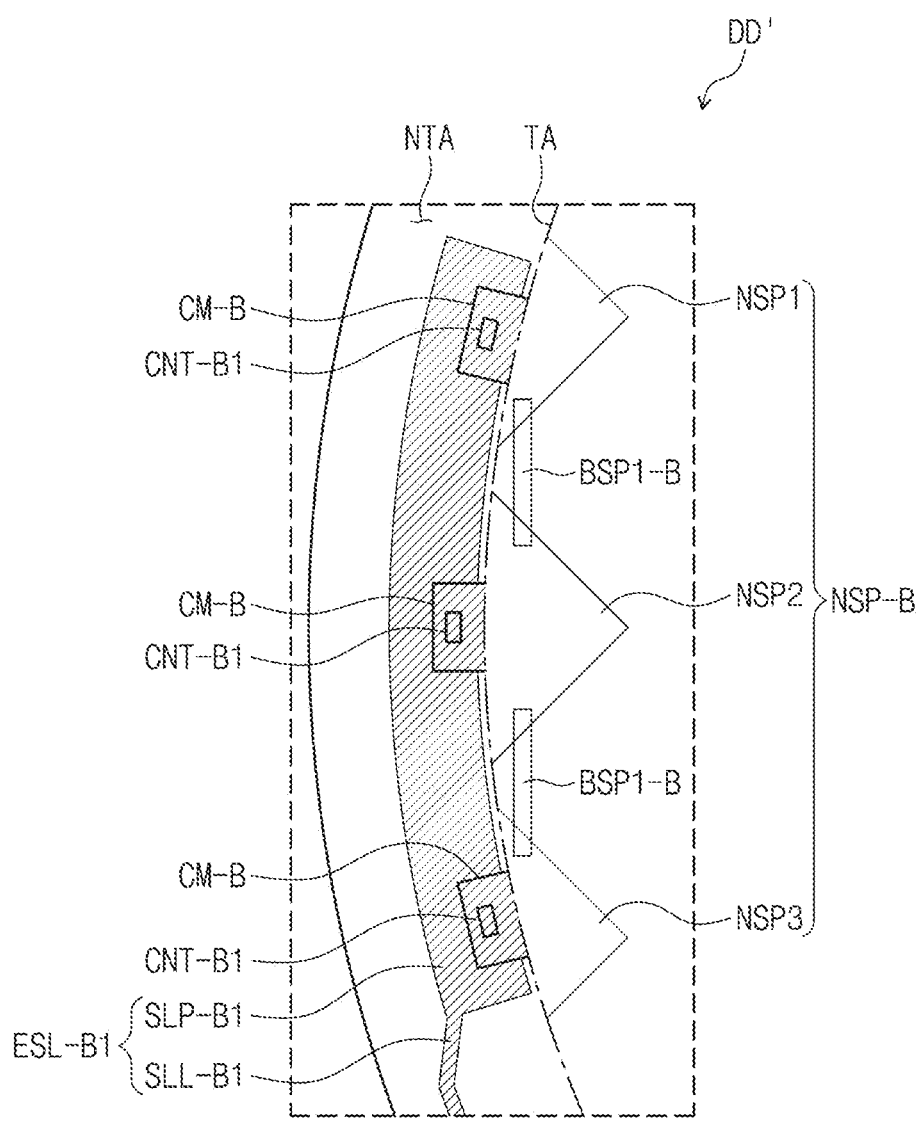
FIG. 9A, FIG. 9B, FIG. 9C, and FIG. 9D are plan views illustrating input sensing units according to exemplary embodiments of the present invention.

As illustrated in FIG. 9A, a connection trace line ESL-B1 may include a line portion SLL-B1 and a pad portion SLP-B1. The connection trace line ESL-B may be spaced apart from a boundary of the sensing area TA and may be adjacent to the notch patterns NSP-B.

The pad portion SLP-B1 may extend from the line portion SLL-B1. A width of the pad portion SLP-B1 may be greater than a width of the line portion SLL-B1. However, the inventive concepts are not limited thereto. In another exemplary embodiment, the width of the pad portion SLP-B1 may be substantially equal to the width of the line portion SLL-B1.

In an exemplary embodiment, the electronic device EA-B may further include connection portions CM-B which are connected to the notch patterns NSP-B, respectively. The connection portion CM-B may protrude in a direction toward the non-sensing area NTA. The connection portion CM-B may overlap with the pad portion SLP-B1 when viewed in a plan view. The connection portion CM-B may be connected to the pad portion SLP-B1 through a contact hole CNT-B1.

The connection portion CM-B may be a separate pattern independent of the notch pattern NSP-B. Here, at least a portion of the connection portion CM-B may be in contact with the notch pattern NSP-B. Alternatively, the connection portion CM-B and the notch pattern NSP-B may constitute a single unitary body. In this case, the notch patterns NSP-B and the connection portions CM-B may be formed of the same material and may be formed at the same time by the same process.

The connection portion CM-B having a rectangular shape is illustrated in FIG. 9A. However, the inventive concepts are not limited thereto. In another exemplary embodiment, the connection portion CM-B may have one of other various shapes protruding in the direction toward the non-sensing area NTA to overlap with the pad portion SLP-B1 in a plan view.

Figure 9B:
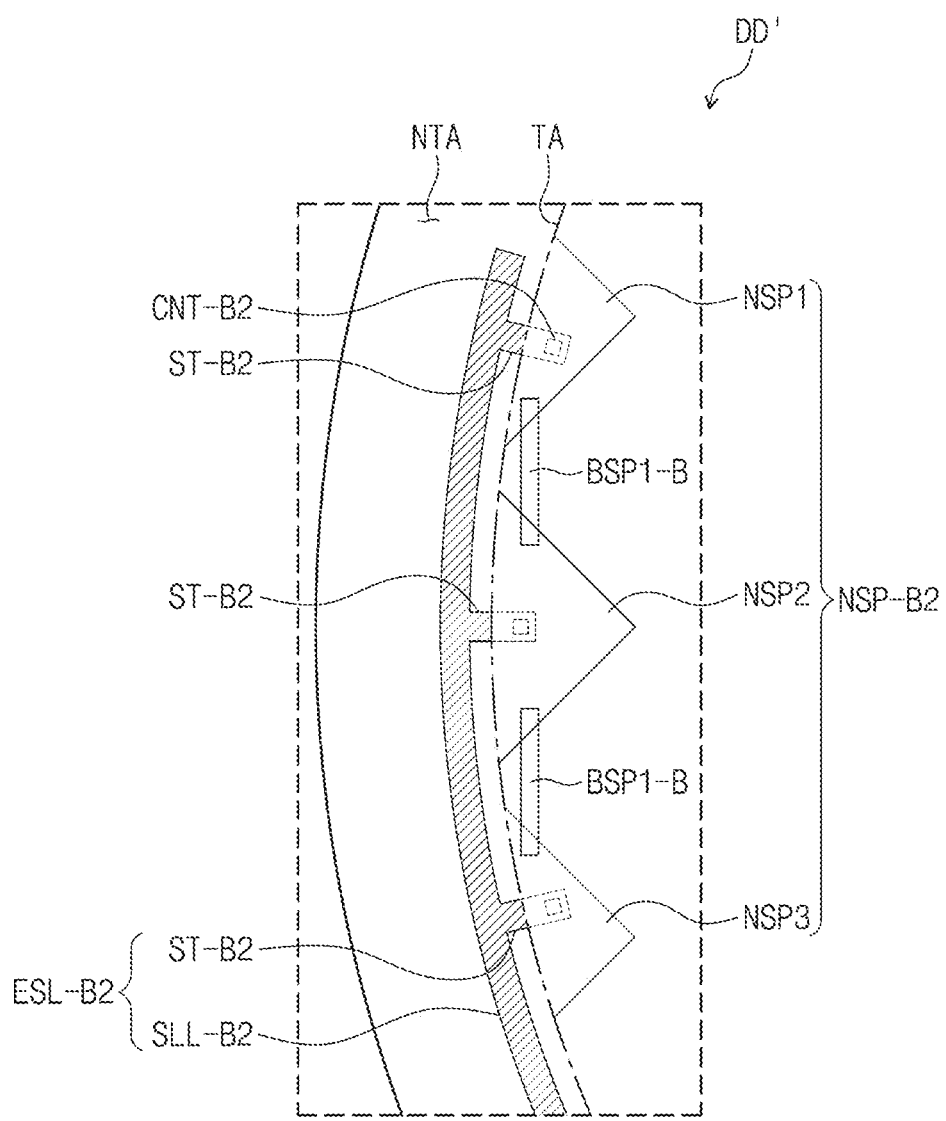

A portion of a connection trace line ESL-B2 of FIG. 9B may protrude into the sensing area TA, unlike what is shown in FIG. 9A.

In an exemplary embodiment, the connection trace line ESL-B2 may include a line portion SLL-B2 and an additional pattern ST-B2. The additional pattern ST-B2 may protrude from the line portion SLL-B2 in a direction toward the sensing area TA. Thus, the additional pattern ST-B2 may overlap with each of notch patterns NSP-B2 when viewed in a plan view. The additional pattern ST-B2 may be connected to the notch pattern NSP-B2 through a contact hole CNT-B2. A portion of the additional pattern ST-B2 is illustrated by a dotted line in FIG. 9B. This may mean that the additional pattern ST-B2 is disposed on a layer different from a layer on which the notch patterns NSP-B2 are disposed.

Figure 9C:
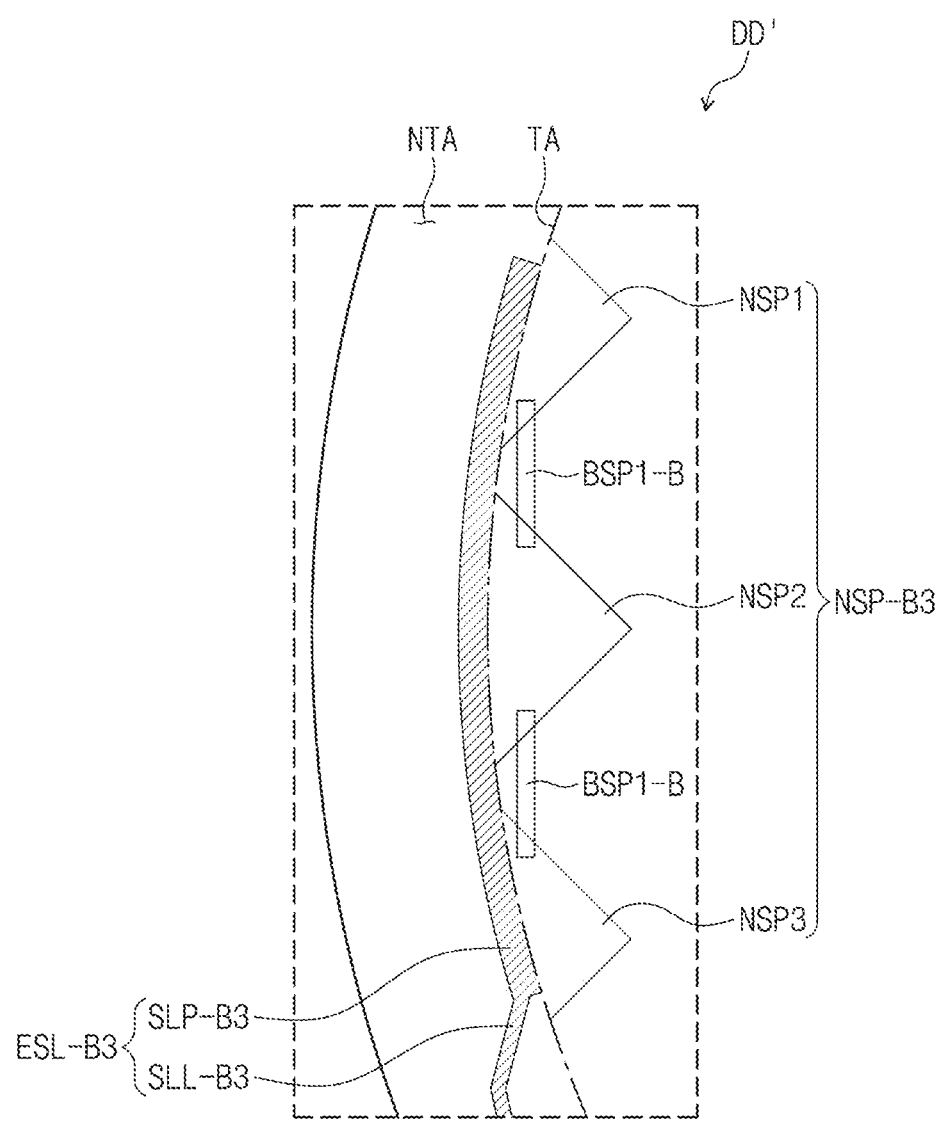

As illustrated in FIG. 9C, a connection trace line ESL-B3 may include a line portion SLL-B3 and a pad portion SLP-B3.

The pad portion SLP-B3 may extend from the line portion SLL-B3. The pad portion SLP-B3 may be disposed in the non-sensing area NTA and may meet a boundary of the non-sensing area NTA and the sensing area TA. Thus, the pad portion SLP-B3 may be in direct contact with notch patterns NSP-B3 arranged along the boundary of the sensing area TA. In this case, the pad portion SLP-B3 and the notch patterns NSP-B3 may be disposed on the same layer. In addition, the pad portion SLP-B3 and the notch patterns NSP-B3 may include the same material.

Since the pad portion SLP-B3 and the notch patterns NSP-B3 are connected to each other on the same layer, the process of forming the contact hole CNT-B1 or CNT-B2 may be omitted, unlike what is shown in FIGS. 9A and 9B.

Figure 9D:
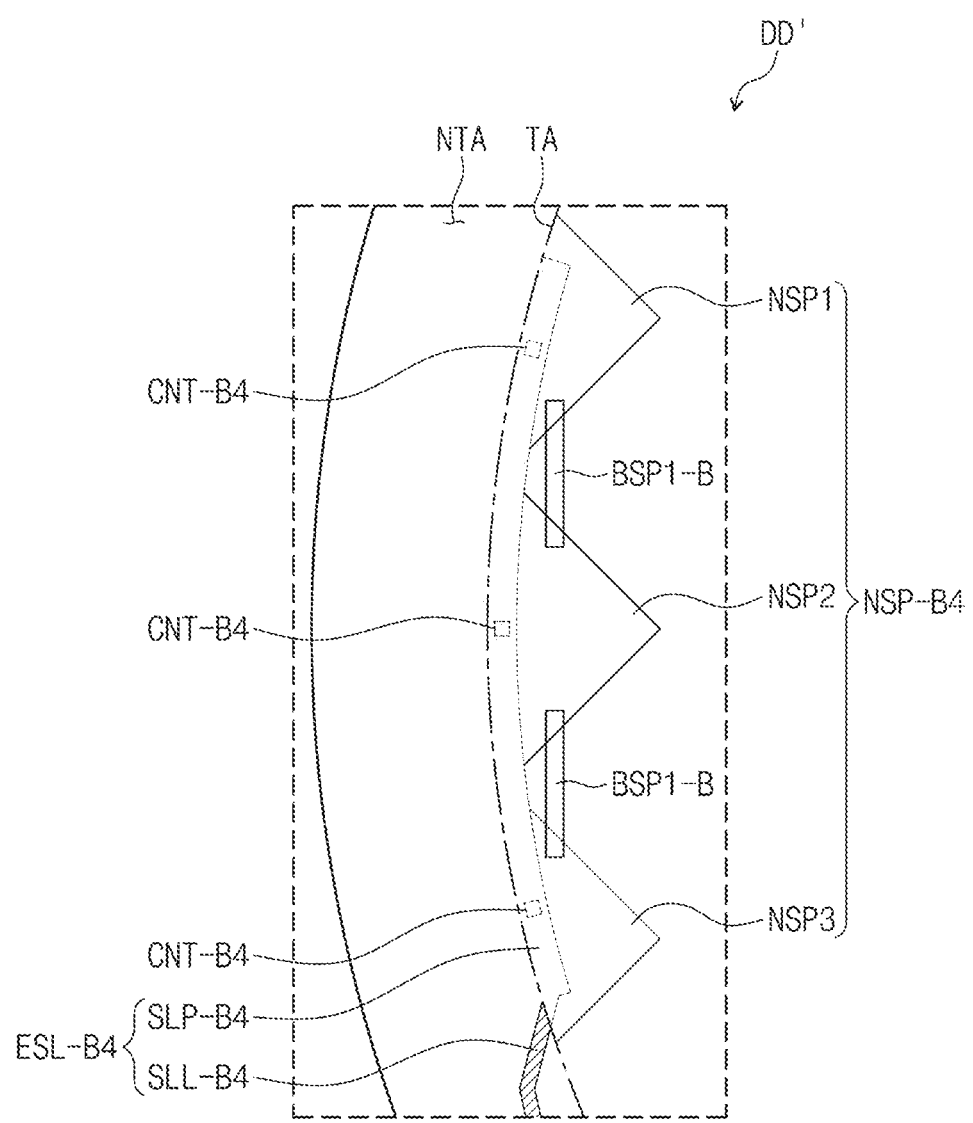

Referring to FIG. 9D, a connection trace line ESL-B4 may include a line portion SLL-B4 and a pad portion SLP-B4. The pad portion SLP-B4 extending from the line portion SLL-B4 may be disposed in the sensing area TA, unlike FIG. 9C. Thus, the pad portion SLP-B4 may overlap with notch patterns NSP-B4 when viewed in a plan view. The pad portion SLP-B4 may be connected to the notch patterns NSP-B4 through contact holes CNT-B4.

However, exemplary embodiments of the inventive concepts are not limited thereto. When the pad portion SLP-B4 and the notch patterns NSP-B4 are formed on the same layer by the same process, the pad portion SLP-B4 and the notch patterns NSP-B4 may constitute a single unitary body.

According to exemplary embodiments of the present invention, the touch sensitivity of the sensing area in which a portion of the connection pattern connecting the notch patterns is removed may be improved to correspond to the touch sensitivity of a central portion of the sensing area. Thus, the input sensing unit and the electronic device including the same may have the touch sensitivity which is substantially uniform in the whole area regardless of the shape of the input sensing unit.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising: a base member comprising a sensing area and a non-sensing area adjacent to the sensing area, the sensing area comprising: a first area; a second area protruding from the first area in one direction; and a third area spaced apart from the second area and protruding from the first area in the one direction, when viewed in a plan view; and an input sensing unit disposed on the base member and configured to sense an external input, wherein: the input sensing unit comprises: first electrodes comprising: first patterns comprising normal patterns disposed in the sensing area and notch patterns disposed in the second and third areas; first connection patterns connecting the first patterns; a contact portion disposed in the non-sensing area and spaced apart from the notch patterns; and connection portions extended from the notch patterns and connected to the contact portion; a second electrode comprising: sensor patterns spaced apart from the first patterns in a plan view; and second connection patterns connecting the sensor patterns; a first trace line disposed in the non-sensing area and connected to one of the normal patterns; a second trace line disposed in the non-sensing area and connected to one of the sensor patterns; a connection trace line connected to at least two of the notch patterns; and a plurality of guard lines disposed on the same layer as the connection trace line and electrically insulated from the connection trace line and disposed on a different layer as the connection portions.

2. The electronic device of claim 1, wherein:
the input sensing unit further comprises a connection portion connected to the notch pattern and protruding toward the non-sensing area to overlap with the non-sensing area in a plan view; and
the connection trace line overlaps with the connection portion when viewed in a plan view.

3. The electronic device of claim 2, wherein:
the input sensing unit further comprises an insulating layer disposed between the connection trace line and the connection portion;
the insulating layer includes an opening exposing a portion of the connection trace line; and
the connection trace line is connected to the connection portion through the opening.

4. The electronic device of claim 1, wherein the connection trace line is disposed on a layer different from a layer on which the notch patterns are disposed.

5. The electronic device of claim 4, wherein:
the first patterns and the sensor patterns are disposed on the same layer; and
the first connection patterns are disposed on a layer different from the layer on which the first patterns are disposed.

6. The electronic device of claim 1, wherein the connection trace line connects the notch patterns, which are connected to each other by the first connection pattern.

7. The electronic device of claim 1, wherein:
each of the second connection patterns includes an opening; and
each of the first connection patterns comprises:
an island pattern disposed between two patterns of the first patterns and disposed in the opening;
a first branch pattern connecting one of the two patterns to the island pattern; and
a second branch pattern connecting the other of the two patterns to the island pattern.

8. The electronic device of claim 1, wherein:
the input sensing unit further comprises a dummy pattern disposed between the sensor patterns; and
the dummy pattern comprises a same material as the sensor patterns.

9. The electronic device of claim 1, wherein:
the input sensing unit further comprises: an auxiliary line disposed in the non-sensing area and connecting the sensor pattern disposed in the second area to the sensor pattern disposed in the third area; and
the connection trace line is electrically insulated from the auxiliary line.

10. The electronic device of claim 9, wherein the auxiliary line and the connection trace line are disposed on the same layer.

11. The electronic device of claim 9, wherein:
the connection trace line comprises an additional pattern protruding in a direction toward the notch patterns; and
the additional pattern is connected to the notch patterns and is disposed on a layer different from a layer on which the auxiliary line is disposed.

12. The electronic device of claim 1, wherein:
the notch patterns are arranged along sides of the second and third areas which face each other; and
areas of the notch patterns are less than areas of the normal patterns.

13. An electronic device comprising:
a base member comprising a sensing area and a non-sensing area adjacent to the sensing area, the sensing area comprising: a first area; a second area protruding from the first area in one direction; and a third area spaced apart from the second area and protruding from the first area in the one direction, when viewed in a plan view; and
an input sensing unit disposed on the base member and configured to sense an external input,
wherein:
the input sensing unit comprises:
first electrodes comprising:
first patterns comprising normal patterns disposed in the sensing area and notch patterns disposed in the second and third areas;
first connection patterns connecting the first patterns;
a contact portion disposed in the non-sensing area and spaced apart from the notch patterns; and
connection portions extended from the notch patterns and connected to the contact portion;
a second electrode comprising:
sensor patterns spaced apart from the first patterns in a plan view; and
second connection patterns connecting the sensor patterns;
a first trace line disposed in the non-sensing area and connected to one of the normal patterns;
a second trace line disposed in the non-sensing area and connected to one of the sensor patterns; and
a connection trace line connected to at least two of the notch patterns;
each of the second connection patterns includes an opening;
each of the first connection patterns comprises:
an island pattern disposed between two patterns of the first patterns and disposed in the opening;
a first branch pattern connecting one of the two patterns to the island pattern; and
a second branch pattern connecting the other of the two patterns to the island pattern; and
a sidewall of the island pattern is spaced apart from a sidewall of the opening to allow the island to be in a floating form.

* * * * *